(12) United States Patent
Gajaria et al.

(10) Patent No.: US 8,231,431 B2
(45) Date of Patent: Jul. 31, 2012

(54) SOLAR PANEL EDGE DELETION MODULE

(75) Inventors: Dhruv Gajaria, Sunnyvale, CA (US);
Zhiyong Li, San Jose, CA (US);
Gopalakrishna B. Prabhu, San Jose, CA (US); Yacov Elgar, Sunnyvale, CA (US); John Visitacion, Newark, CA (US); Yong Liu, San Jose, CA (US);
Jeffrey S. Sullivan, Castro Valley, CA (US); Salvador Umotoy, Antioch, CA (US); Tai T. Ngo, Dublin, CA (US);
Michael Marriott, Morgan Hill, CA (US); Peter Crundwell, Horsham (GB);
Vinay Shah, San Mateo, CA (US); Ho Gene Choi, Santa Clara, CA (US);
Dennis C. Pierce, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 731 days.

(21) Appl. No.: 12/358,814

(22) Filed: Jan. 23, 2009

(65) Prior Publication Data

US 2009/0221217 A1    Sep. 3, 2009

Related U.S. Application Data

(60) Provisional application No. 61/023,214, filed on Jan. 24, 2008, provisional application No. 61/034,931, filed on Mar. 7, 2008, provisional application No. 61/111,705, filed on Nov. 5, 2008.

(51) Int. Cl.
*B24B 49/00* (2006.01)
*B24B 7/06* (2006.01)
*B24B 53/21* (2006.01)

(52) U.S. Cl. .............. 451/8; 451/21; 451/194; 451/213; 451/443

(58) Field of Classification Search .................. 451/8, 9, 451/11, 21, 22, 44, 54–58, 194, 213, 444, 451/450, 461, 463, 443, 336
See application file for complete search history.

(56) References Cited

U.S. PATENT DOCUMENTS 1,458,528 A * 6/1923 Emery ........................... 451/463
(Continued)

FOREIGN PATENT DOCUMENTS
WO    WO 2008/092186    8/2008

OTHER PUBLICATIONS

PCT International Search Report and Written Opinion dated Mar. 10, 2009 for International Application No. PCT/US2009/31835.

(Continued)

*Primary Examiner* — Hadi Shakeri
(74) *Attorney, Agent, or Firm* — Patterson & Sheridan, LLP

(57) ABSTRACT

The present invention generally relates to an edge deletion module positioned within an automated solar cell fabrication line. The edge deletion module may include a grinding wheel device for removing material from edge regions of a solar cell device and cleaning the edge regions of the solar cell device after removing the material. The edge deletion module may also include an abrasive element, a portion of which is ground as it is periodically, laterally advanced toward the grinding wheel device. A controller is provided for controlling the operation and function of various facets of the module.

19 Claims, 18 Drawing Sheets

U.S. PATENT DOCUMENTS

| | | | |
|---|---|---|---|
| 4,638,601 A | | 1/1987 | Steere et al. |
| 5,036,624 A | | 8/1991 | Steere, Jr. |
| 5,036,628 A | | 8/1991 | Steere, III et al. |
| 5,069,234 A | * | 12/1991 | Nielsen ............................. 451/9 |
| 5,258,077 A | | 11/1993 | Shahryar |
| 5,658,189 A | | 8/1997 | Kagamida |
| 5,679,060 A | | 10/1997 | Leonard et al. |
| 5,738,563 A | | 4/1998 | Shibata |
| 5,827,111 A | | 10/1998 | Ball |
| 5,846,125 A | * | 12/1998 | Robichon ..................... 451/450 |
| 5,951,387 A | * | 9/1999 | Wen ............................... 451/443 |
| 6,077,722 A | | 6/2000 | Jansen et al. |
| 6,089,964 A | | 7/2000 | Adams |
| 6,095,897 A | | 8/2000 | Stocker et al. |
| 6,152,809 A | * | 11/2000 | Yenawine ....................... 451/11 |
| 6,248,003 B1 | * | 6/2001 | Hoshiya et al. ................. 451/56 |
| 6,288,325 B1 | | 9/2001 | Jansen et al. |
| 6,423,565 B1 | | 7/2002 | Barth et al. |
| 6,428,397 B1 | | 8/2002 | Stocker |
| 6,429,037 B1 | | 8/2002 | Wenham et al. |
| 6,431,949 B1 | * | 8/2002 | Ishikawa et al. ................ 451/21 |
| 6,454,636 B1 | * | 9/2002 | Iwabuchi ...................... 451/450 |
| 6,609,956 B2 | * | 8/2003 | Margaria ........................ 451/44 |
| 6,656,818 B1 | | 12/2003 | Kishimoto |
| 6,784,361 B2 | | 8/2004 | Carlson et al. |
| 7,659,201 B2 | * | 2/2010 | Ohashi et al. ................. 438/672 |
| 2003/0004539 A1 | | 1/2003 | Linder et al. |
| 2003/0129810 A1 | | 7/2003 | Barth et al. |
| 2004/0157531 A1 | | 8/2004 | Mikhaylich et al. |
| 2005/0072455 A1 | | 4/2005 | Gerhardinger et al. |
| 2006/0009134 A1 | | 1/2006 | Katayama |
| 2006/0141792 A1 | | 6/2006 | Ohashi et al. |
| 2007/0032170 A1 | | 2/2007 | Halley et al. |

OTHER PUBLICATIONS

Paul A. Basore. "Large-Area Deposition for Crystalline Silicon on Glass Modules", May 2003. pp. 1-4.

* cited by examiner

FIG. 11B VIEW B-B

SOLAR PANEL EDGE DELETION MODULE

CROSS-REFERENCE TO RELATED APPLICATIONS

This application claims benefit of U.S. Provisional Patent Application Ser. No. 61/023,214 filed Jan. 24, 2008, U.S. Provisional Patent Application Ser. No. 61/034,931, filed Mar. 7, 2008, and U.S. Provisional Patent Application Ser. No. 61/111,705, filed Nov. 5, 2008, each of which is incorporated by reference in its entirety herein.

This application is related to U.S. application Ser. No. 12/202,199, filed Aug. 29, 2008 and U.S. application Ser. No. 12/201,840, filed Aug. 29, 2008.

BACKGROUND OF THE INVENTION

1. Field of the Invention

Embodiments of the present invention generally relate to apparatus and processes for performing thin-film panel edge deletion on a solar cell device in a solar cell production line.

2. Description of the Related Art

Photovoltaic (PV) devices or solar cells are devices which convert sunlight into direct current (DC) electrical power. Typical thin film PV devices, or thin film solar cells, have one or more p-i-n junctions. Each p-i-n junction comprises a p-type layer, an intrinsic type layer, and an n-type layer. When the p-i-n junction of the solar cell is exposed to sunlight (consisting of energy from photons), the sunlight is converted to electricity through the PV effect. Solar cells may be tiled into larger solar arrays. The solar arrays are created by connecting a number of solar cells and joining them into panels with specific frames and connectors.

Typically, a thin film solar cell includes active regions, or photoelectric conversion units, and a transparent conductive oxide (TCO) film disposed as a front electrode and/or as a back electrode. The photoelectric conversion unit includes a p-type silicon layer, an n-type silicon layer, and an intrinsic type (i-type) silicon layer sandwiched between the p-type and n-type silicon layers. Several types of silicon films including microcrystalline silicon film (μc-Si), amorphous silicon film (a-Si), polycrystalline silicon film (poly-Si), and the like may be utilized to form the p-type, n-type, and/or i-type layers of the photoelectric conversion unit. The backside electrode may contain one or more conductive layers.

With traditional energy source prices on the rise, there is a need for a low cost way of producing electricity using a low cost solar cell device. Conventional solar cell fabrication processes include a number of inefficient operations that lead to unacceptable production line downtime. Seaming and edge deletion are standard operations necessary for the fabrication of solar cells. This process provides electrical separation of the active cells in a solar module as well as electrical isolation and sealing from the outside environment by removing the conductive layers along the edge of the solar cell module. Conventional edge deletion techniques are performed with a belt sanding mechanism. Edge deletion by belt sanding is adequate, but the life of the belts themselves is unacceptably short, resulting in frequent maintenance intervals. Excessive consumption of sanding belts is due, in part, to the tendency of abraded material to collect and adhere to the abrasive surface of the belt, a problem which is inherent to most, if not all, abrading mechanisms and techniques. This, of course, results in high maintenance costs, excessive downtime, poor throughput, and ultimately, high solar cell cost. Accordingly, a need exists for a seaming and edge deletion module that is reliable, efficient, and easily maintained.

SUMMARY OF THE INVENTION

In one embodiment of the present invention, a module for performing an edge deletion process on a solar cell device comprises an inlet conveyor configured to transport the solar cell device into the module, an edge deletion station configured to remove material from a top surface of the solar cell device at opposing edge regions of the solar cell device, and a cleaning assembly. In one embodiment, the edge deletion station comprises a station support structure, a stationary grinding wheel device attached to the station support structure, a movable grinding wheel device disposed on the station support structure, a first automatic dressing device attached to the stationary grinding wheel device, and a second automatic dressing device attached to the movable grinding wheel device.

In another embodiment, a module for performing an edge deletion process on a solar cell device comprises an inlet conveyor configured to transport the solar cell device into the module, a first edge deletion station configured to remove material from the top surface of the solar cell device at opposing edge regions of the solar cell device, a second edge deletion station configured to material from the top surface of the solar cell device at the remaining opposing edge regions of the solar cell device, a cross transfer station configured to transport the solar cell device from the first edge deletion station to the second edge deletion station, and an outlet conveyor configured to transport the solar cell device out of the module. In one embodiment, the first edge deletion station comprises a station support structure, a stationary grinding wheel device, and a movable grinding wheel device. In one embodiment, the second edge deletion station comprises a station support structure, a stationary grinding wheel device, and a movable grinding wheel device.

In yet another embodiment of the present invention, a method for preparing edges of a solar cell device comprises advancing the solar cell device into a first edge deletion station, grinding two opposing edge regions of the solar cell device by applying a constant pressure onto the surface of the solar cell device with a first stationary grinding wheel device and a first movable grinding wheel device, applying fluid to the two opposing edge regions, transferring the solar cell device into a second edge deletion station without rotating the solar cell device, grinding the remaining two opposing edge regions by applying a constant pressure onto the surface of the solar cell device with second stationary grinding wheel device and a second movable grinding wheel device, applying fluid to the remaining two opposing edge regions, and removing the solar cell device from the second edge deletion station.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 11B is a side view of a substrate having an edge region prepared according to one embodiment of the present invention.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present invention generally relates to an edge deletion module positioned within an automated solar cell fabrication line. The automated solar cell fabrication line is generally an arrangement of automated processing modules and automation equipment used to form solar cell devices. The automated solar fabrication line generally comprises a substrate receiving module, one or more absorbing layer deposition cluster tools having at least one processing chamber to deposit a silicon-containing layer on a surface of the substrate, one or more back contact deposition chambers to deposit a back contact layer on a surface of the substrate, one or more material removal chambers adapted to remove material from a surface of the substrate, a substrate cutting module, a module for preparing substrate surfaces and edges (such as an edge deletion module), a solar cell encapsulation device, an autoclave module adapted to heat and expose a composite substrate to a pressure greater than atmospheric pressure, a junction box attaching module to attach a connection element for connecting solar cells to external components, and one or more quality assurance modules adapted to test and qualify the formed solar cell device.

Figure 1:
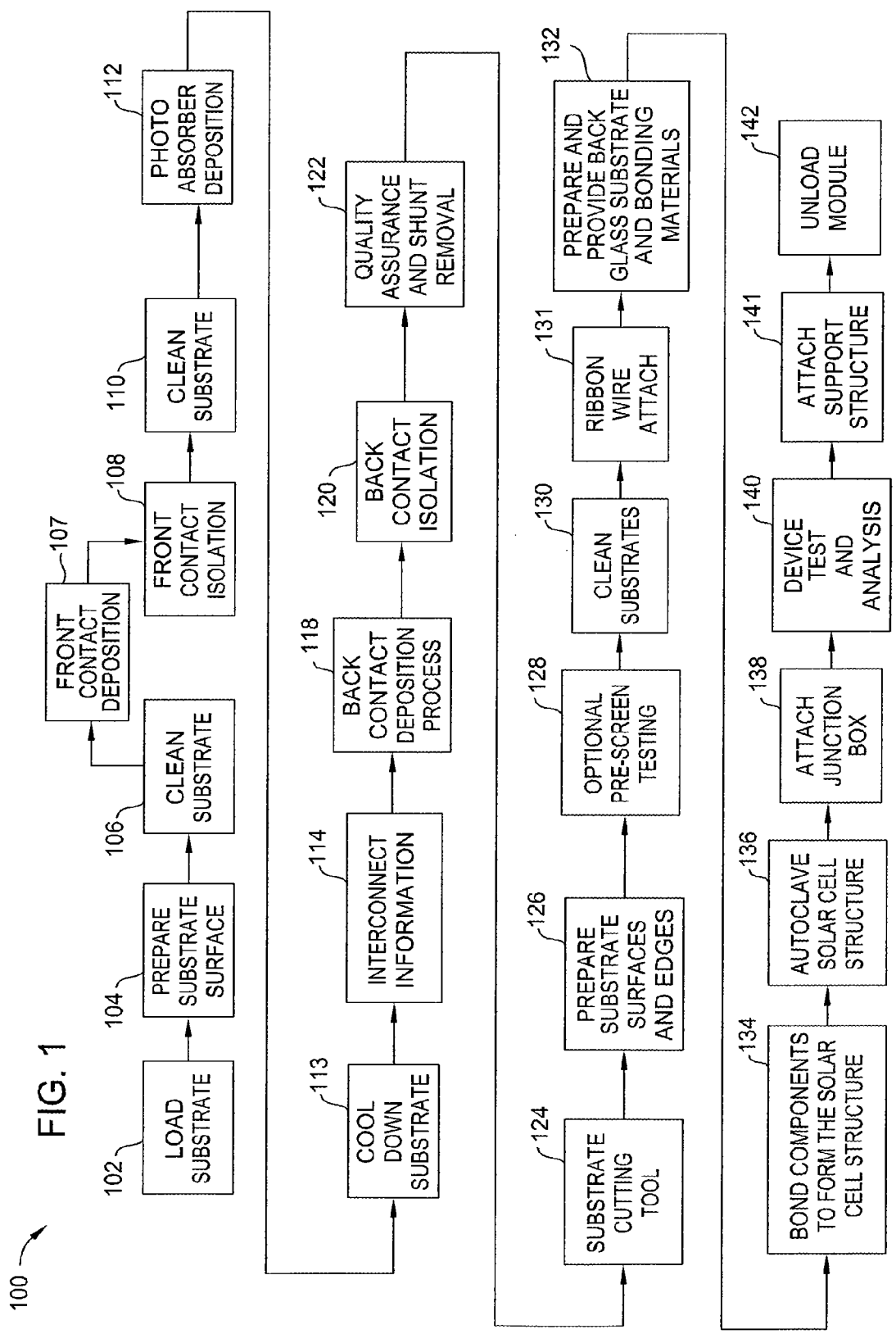
FIG. 1 illustrates a process sequence for forming a solar cell device according to one embodiment described herein.
Figure 2:
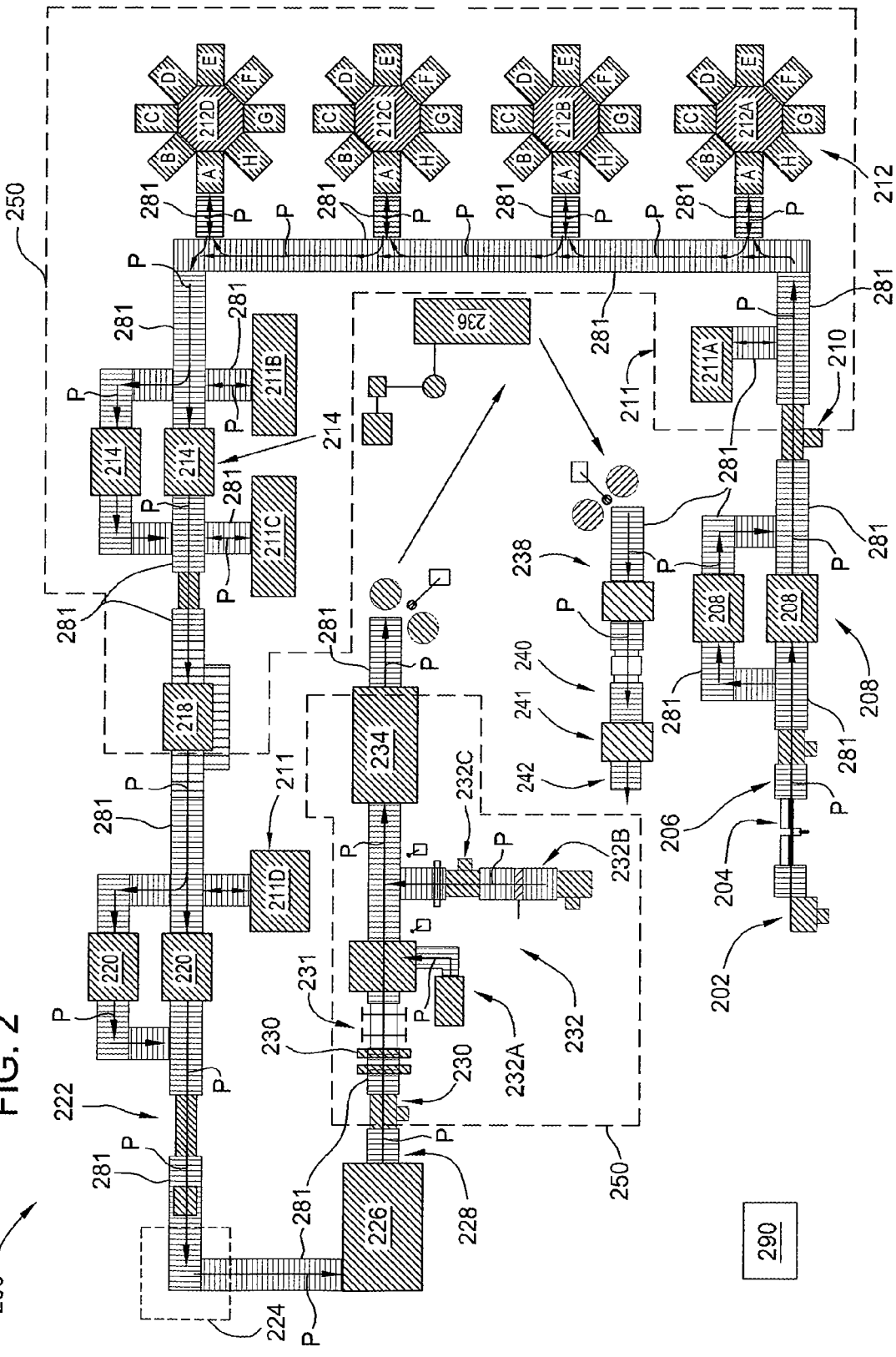
FIG. 2 illustrates a plan view of a solar cell production line according to one embodiment described herein.

FIG. 1 illustrates one embodiment of a process sequence 100 that contains a plurality of steps (i.e., steps 102-142) that are each used to form a solar cell device using a novel solar cell production line 200 described herein. The configuration, number of processing steps, and order of the processing steps in the process sequence 100 is not intended to be limiting to the scope of the invention described herein. FIG. 2 is a plan view of one embodiment of the production line 200, which is intended to illustrate some of the typical processing modules and process flows through the system and other related aspects of the system design, and is thus not intended to be limiting to the scope of the invention described herein.

A system controller 290 may be used to control one or more components found in the solar cell production line 200. The system controller 290 facilitates the control and automation of the overall solar cell production line 200 and typically includes a central processing unit (CPU) (not shown), memory (not shown), and support circuits (or I/O) (not shown). The CPU may be one of any form of computer processors that are used in industrial settings for controlling various system functions, substrate movement, chamber processes, and support hardware (e.g., sensors, robots, motors, lamps, etc.), and monitor the processes (e.g., substrate support temperature, power supply variables, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like.

A program (or computer instructions) readable by the system controller 290 determines which tasks are performable on a substrate. Preferably, the program is software readable by the system controller 290 that includes code to perform tasks relating to monitoring, moving, supporting, and/or positioning of a substrate along with various process recipe tasks and various chamber process recipe steps performed in the solar cell production line 200. In one embodiment, the system controller 290 also contains a plurality of programmable logic controllers (PLC's) that are used to locally control one or more modules in the solar cell production and a material handling system controller (e.g., PLC or standard computer) that deals with the higher level strategic moving, scheduling, and running of the complete solar cell production line.

Figure 3A:
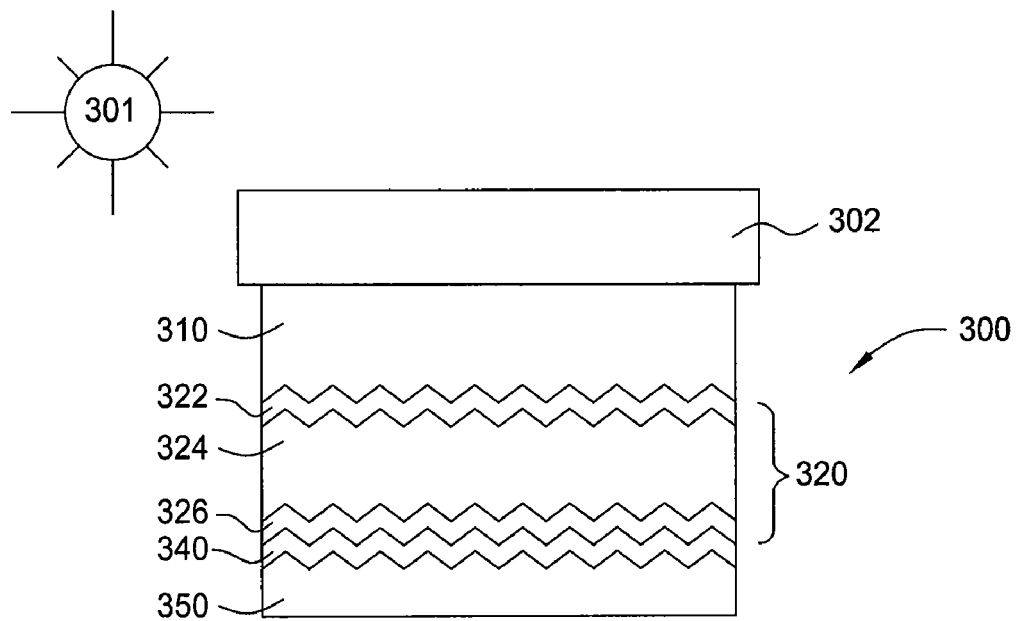
FIG. 3A is a side cross-sectional view of a thin film solar cell device according to one embodiment described herein.

Examples of a solar cell 300 that can be formed and tested using the process sequences illustrated in FIG. 1 and the components illustrated in the solar cell production line 200 are illustrated in FIGS. 3A-3E. FIG. 3A is a simplified schematic diagram of a single junction amorphous or micro-crystalline silicon solar cell 300 that can be formed and analyzed in the system described below.

As shown in FIG. 3A, the single junction amorphous or micro-crystalline silicon solar cell 300 is oriented toward a light source or solar radiation 301. The solar cell 300 generally comprises a substrate 302, such as a glass substrate, polymer substrate, metal substrate, or other suitable substrate, with thin films formed thereover. In one embodiment, the substrate 302 is a glass substrate that is about 2200 mm×2600 mm×3 mm in size. The solar cell 300 further comprises a first transparent conducting oxide (TCO) layer 310 (e.g., zinc oxide (ZnO), tin oxide (SnO)) formed over the substrate 302, a first p-i-n junction 320 formed over the first TCO layer 310, a second TCO layer 340 formed over the first p-i-n junction 320, and a back contact layer 350 formed over the second TCO layer 340. To improve light absorption by enhancing light trapping, the substrate and/or one or more of the thin films formed thereover may be optionally textured by wet, plasma, ion, and/or mechanical processes. For example, in the embodiment shown in FIG. 3A, the first TCO layer 310 is textured, and the subsequent thin films deposited thereover generally follow the topography of the surface below it.

In one configuration, the first p-i-n junction 320 may comprise a p-type amorphous silicon layer 322, an intrinsic type amorphous silicon layer 324 formed over the p-type amorphous silicon layer 322, and an n-type microcrystalline silicon layer 326 formed over the intrinsic type amorphous silicon layer 324. In one example, the p-type amorphous silicon layer 322 may be formed to a thickness between about 60 Å and about 300 Å, the intrinsic type amorphous silicon layer 324 may be formed to a thickness between about 1,500 Å and about 3,500 Å, and the n-type microcrystalline silicon layer 326 may be formed to a thickness between about 100 Å and about 400 Å. The back contact layer 350 may include, but is not limited to, a material selected from the group consisting of Al, Ag, Ti, Cr, Au, Cu, Pt, Ni, Mo, conductive carbon, alloys thereof, and combinations thereof.

Figure 3B:
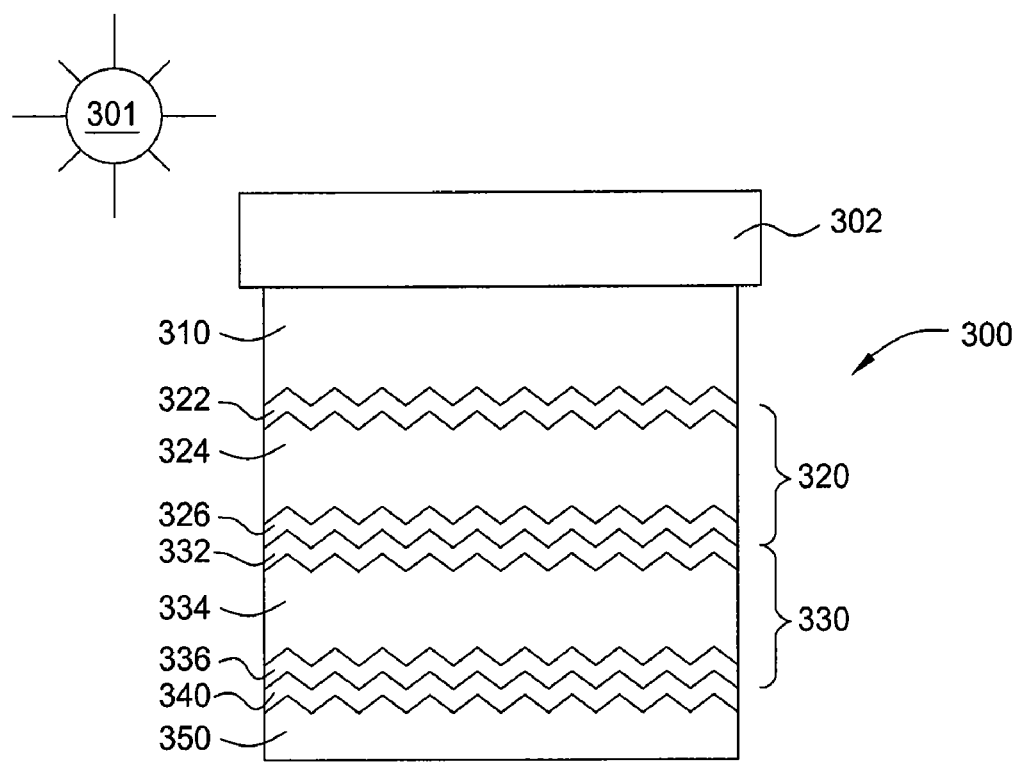
FIG. 3B is a side cross-sectional view of a thin film solar cell device according to one embodiment described herein.

FIG. 3B is a schematic diagram of an embodiment of a solar cell 300, which is a multi-junction solar cell that is oriented toward the light or solar radiation 301. The solar cell 300 comprises a substrate 302, such as a glass substrate, polymer substrate, metal substrate, or other suitable substrate, with thin films formed thereover. The solar cell 300 may further comprise a first transparent conducting oxide (TCO) layer 310 formed over the substrate 302, a first p-i-n junction 320 formed over the first TCO layer 310, a second p-i-n junction 330 formed over the first p-i-n junction 320, a second TCO layer 340 formed over the second p-i-n junction 330, and a back contact layer 350 formed over the second TCO layer 340.

In the embodiment shown in FIG. 3B, the first TCO layer 310 is textured, and the subsequent thin films deposited thereover generally follow the topography of the surface below it. The first p-i-n junction 320 may comprise a p-type amorphous silicon layer 322, an intrinsic type amorphous silicon layer 324 formed over the p-type amorphous silicon layer 322, and an n-type microcrystalline silicon layer 326 formed over the intrinsic type amorphous silicon layer 324. In one example, the p-type amorphous silicon layer 322 may be formed to a thickness between about 60 Å and about 300 Å, the intrinsic type amorphous silicon layer 324 may be formed to a thickness between about 1,500 Å and about 3,500 Å, and the n-type microcrystalline silicon layer 326 may be formed to a thickness between about 100 Å and about 400 Å.

The second p-i-n junction 330 may comprise a p-type microcrystalline silicon layer 332, an intrinsic type microcrystalline silicon layer 334 formed over the p-type microcrystalline silicon layer 332, and an n-type amorphous silicon layer 336 formed over the intrinsic type microcrystalline silicon layer 334. In one example, the p-type microcrystalline silicon layer 332 may be formed to a thickness between about 100 Å and about 400 Å, the intrinsic type microcrystalline silicon layer 334 may be formed to a thickness between about 10,000 Å and about 30,000 Å, and the n-type amorphous silicon layer 336 may be formed to a thickness between about 100 Å and about 500 Å. The back contact layer 350 may include, but is not limited to a material selected from the group consisting of Al, Ag, Ti, Cr, Au, Cu, Pt, Ni, Mo, conductive carbon, alloys thereof, and combinations thereof.

Figure 3C:
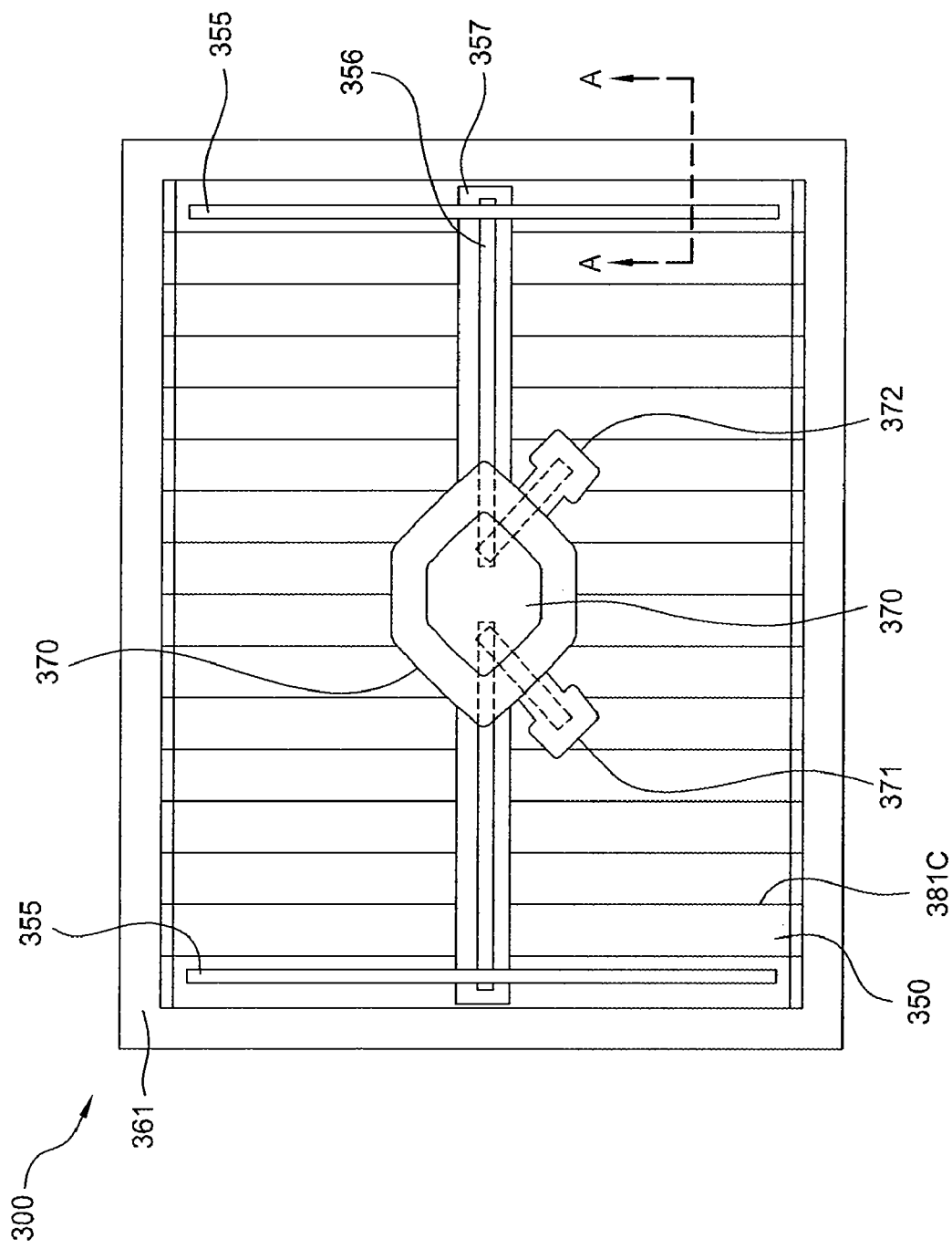
FIG. 3C is a plan view of a composite solar cell structure according to one embodiment described herein.
Figure 3D:
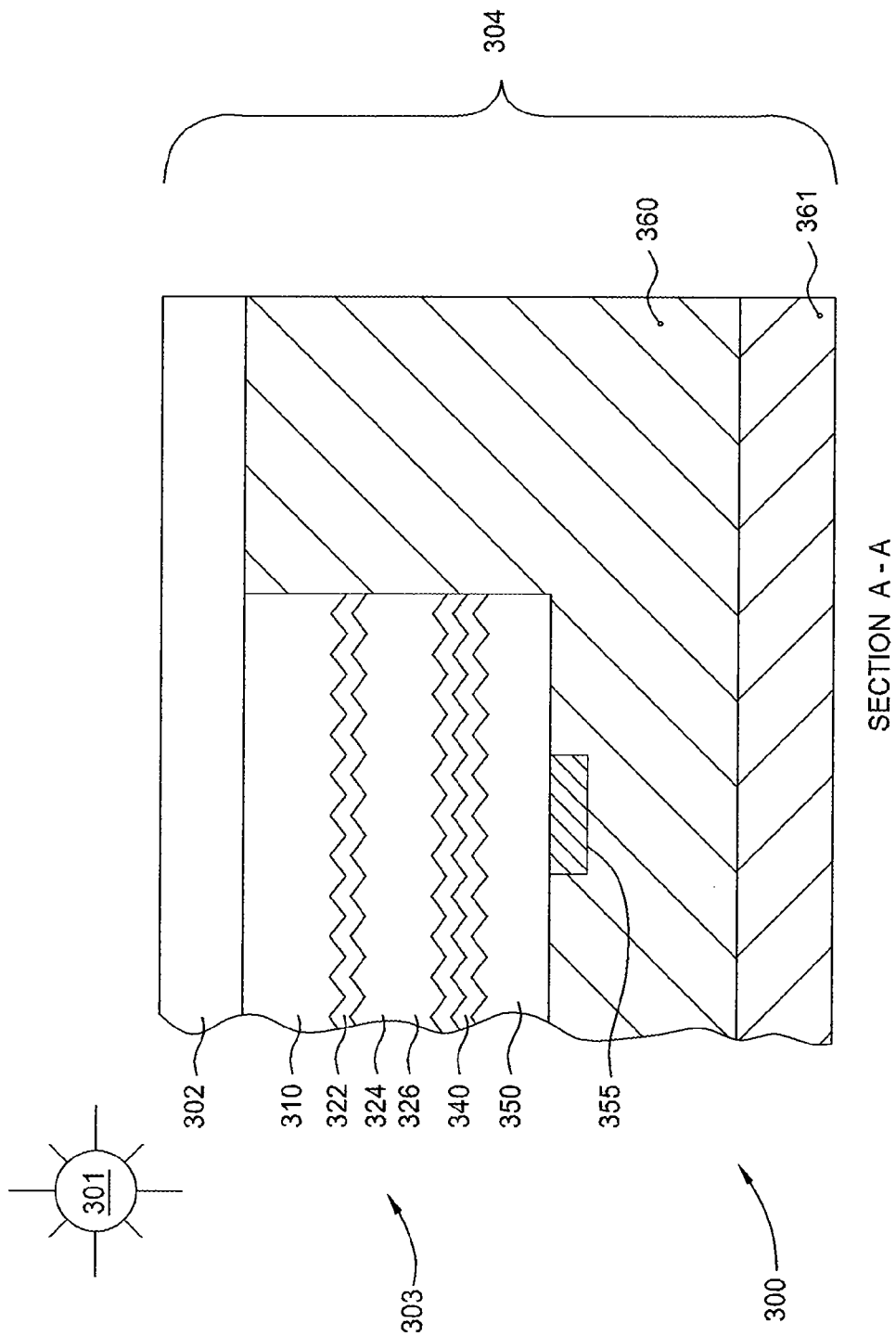
FIG. 3D is a side cross-sectional view along Section A-A of FIG. 3C.

FIG. 3C is a plan view that schematically illustrates an example of the rear surface of a formed solar cell 300 that has been produced and tested in the production line 200. FIG. 3D is a side cross-sectional view of a portion of the solar cell 300 illustrated in FIG. 3C (see section A-A). While FIG. 3D illustrates the cross-section of a single junction cell similar to the configuration described in FIG. 3A, this is not intended to be limiting as to the scope of the invention described herein.

As shown in FIGS. 3C and 3D, the solar cell 300 may contain a substrate 302, the solar cell device elements (e.g., reference numerals 310-350), one or more internal electrical connections (e.g., side buss 355, cross-buss 356), a layer of bonding material 360, a back glass substrate 361, and a junction box 370. The junction box 370 may generally contain two junction box terminals 371, 372 that are electrically connected to portions of the solar cell 300 through the side buss 355 and the cross-buss 356, which are in electrical communication with the back contact layer 350 and active regions of the solar cell 300. To avoid confusion relating to the actions specifically performed on the substrates 302 in the discussion below, a substrate 302 having one or more of the deposited layers (e.g., reference numerals 310-350) and/or one or more internal electrical connections (e.g., side buss 355, cross-buss 356) disposed thereon is generally referred to as a device substrate 303. Similarly, a device substrate 303 that has been bonded to a back glass substrate 361 using a bonding material 360 is referred to as a composite solar cell structure 304.

Figure 3E:
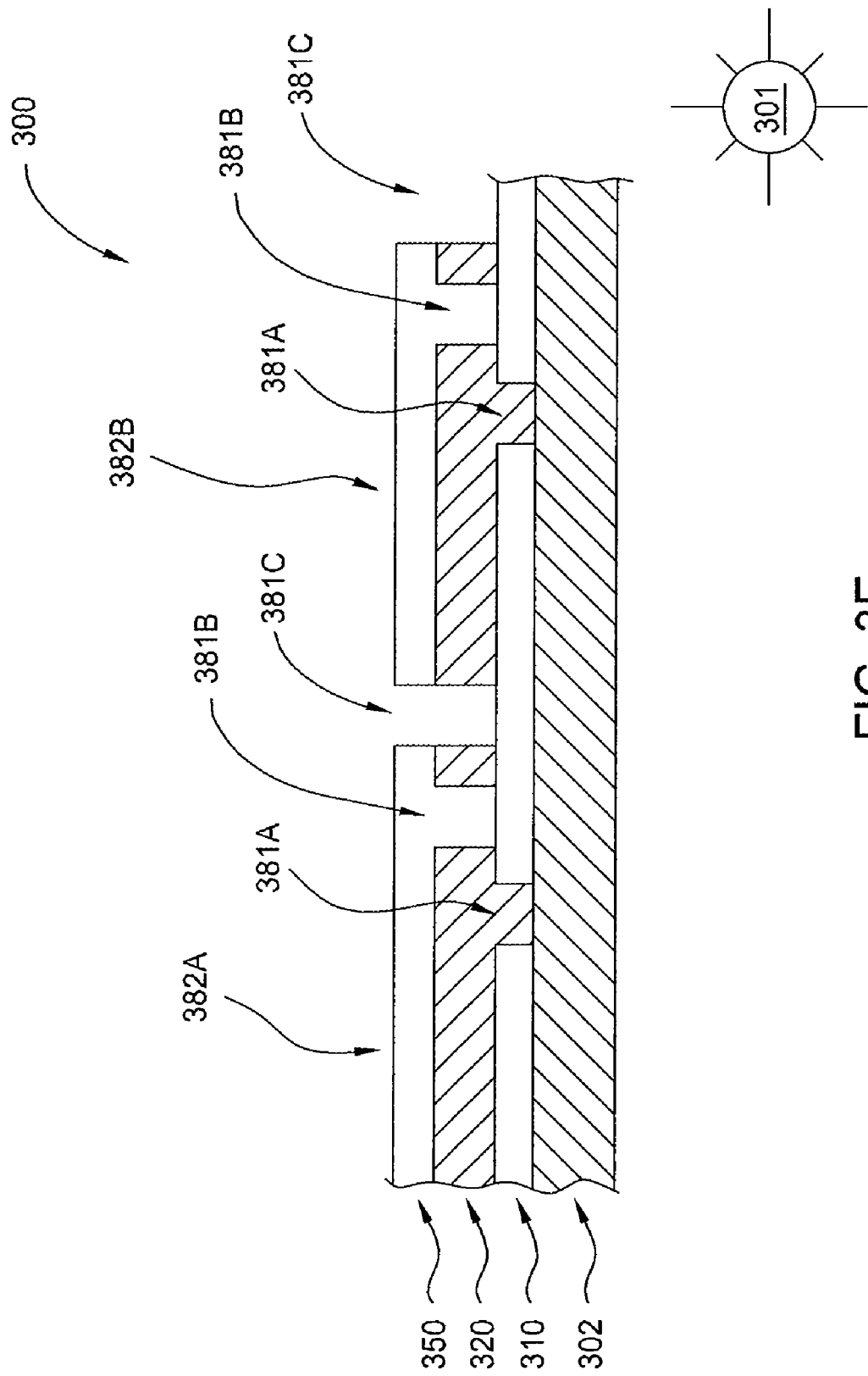
FIG. 3E is a side cross-sectional view of a thin film solar cell device according to one embodiment described herein.

FIG. 3E is a schematic cross-section of a solar cell 300 illustrating various scribed regions used to form the individual cells 382A-382B within the solar cell 300. As illustrated in FIG. 3E, the solar cell 300 includes a transparent substrate 302, a first TCO layer 310, a first p-i-n junction 320, and a back contact layer 350. Three laser scribing steps may be performed to produce trenches 381A, 381B, and 381C, which are generally required to form a high efficiency solar cell device. Although formed together on the substrate 302, the individual cells 382A and 382B are isolated from each other by the insulating trench 381C formed in the back contact layer 350 and the first p-i-n junction 320. In addition, the trench 381B is formed in the first p-i-n junction 320 so that the back contact layer 350 is in electrical contact with the first TCO layer 310. In one embodiment, the insulating trench 381A is formed by the laser scribe removal of a portion of the first TCO layer 310 prior to the deposition of the first p-i-n junction 320 and the back contact layer 350. Similarly, in one embodiment, the trench 381B is formed in the first p-i-n junction 320 by the laser scribe removal of a portion of the first p-i-n junction 320 prior to the deposition of the back contact layer 350. While a single junction type solar cell is illustrated in FIG. 3E this configuration is not intended to be limiting to the scope of the invention described herein.

General Solar Cell Formation Process Sequence

Referring to FIGS. 1 and 2, the process sequence 100 generally starts at step 102 in which a substrate 302 is loaded into the loading module 202 found in the solar cell production line 200. In one embodiment, the substrates 302 are received in a "raw" state where the edges, overall size, and/or cleanliness of the substrates 302 are not well controlled. Receiving "raw" substrates 302 reduces the cost to prepare and store substrates 302 prior to forming a solar device and thus reduces the solar cell device cost, facilities costs, and production costs of the finally formed solar cell device. However, typically, it is advantageous to receive "raw" substrates 302 that have a transparent conducting oxide (TCO) layer (e.g., first TCO layer 310) already deposited on a surface of the substrate 302 before it is received into the system in step 102. If a conductive layer, such as TCO layer, is not deposited on the surface of the "raw" substrates then a front contact deposition step (step 107), which is discussed below, needs to be performed on a surface of the substrate 302.

In one embodiment, the substrates 302 or 303 are loaded into the solar cell production line 200 in a sequential fashion, and thus do not use a cassette or batch style substrate loading system. A cassette style and/or batch loading type system that requires the substrates to be un-loaded from the cassette, processed, and then returned to the cassette before moving to the next step in the process sequence can be time consuming and decrease the solar cell production line throughput. The use of batch processing does not facilitate certain embodiments of the present invention, such as fabricating multiple solar cell devices from a single substrate. Additionally, the use of a batch style process sequence generally prevents the use of an asynchronous flow of substrates through the production line, which may provide improved substrate throughput during steady state processing and when one or more modules are brought down for maintenance or due to a fault condition. Generally, batch or cassette based schemes are not able to achieve the throughput of the production line described herein, when one or more processing modules are brought down for maintenance, or even during normal operation, since the queuing and loading of substrates can require a significant amount of overhead time.

In the next step, step 104, the surfaces of the substrate 302 are prepared to prevent yield issues later on in the process. In one embodiment of step 104, the substrate is inserted into a front end substrate seaming module 204 that is used to prepare the edges of the substrate 302 or 303 to reduce the likelihood of damage, such as chipping or particle generation from occurring during the subsequent processes. Damage to the substrate 302 or 303 can affect device yield and the cost to produce a usable solar cell device. In one embodiment, the front end seaming module 204 is used to round or bevel the edges of the substrate 302 or 303. In one embodiment, a diamond impregnated belt or disc is used to grind the material from the edges of the substrate 302 or 303. In another embodiment, a grinding wheel, grit blasting, or laser ablation technique is used to remove the material from the edges of the substrate 302 or 303.

Next the substrate 302 or 303 is transported to the cleaning module 206, in which step 106, or a substrate cleaning step, is performed on the substrate 302 or 303 to remove any contaminants found on the surface of thereof. Common contaminants may include materials deposited on the substrate 302 or 303 during the substrate forming process (e.g., glass manufacturing process) and/or during shipping or storing of the substrates 302 or 303. Typically, the cleaning module 206 uses wet chemical scrubbing and rinsing steps to remove any undesirable contaminants.

In one example, the process of cleaning the substrate 302 or 303 may occur as follows. First, the substrate 302 or 303 enters a contaminant removal section of the cleaning module 206 from either a transfer table or an automation device 281. In general, the system controller 290 establishes the timing for each substrate 302 or 303 that enters the cleaning module 206. The contaminant removal section may utilize dry cylindrical brushes in conjunction with a vacuum system to dislodge and extract contaminants from the surface of the substrate 302. Next, a conveyor within the cleaning module 206 transfers the substrate 302 or 303 to a pre-rinse section, where spray tubes dispense hot DI water at a temperature, for example, of 50° C. from a DI water heater onto a surface of the substrate 302 or 303. Commonly, since the device substrate 303 has a TCO layer disposed thereon, and since TCO layers are generally electron absorbing materials, DI water is used to avoid any traces of possible contamination and ionizing of the TCO layer. Next, the rinsed substrate 302, 303 enters a wash section. In the wash section, the substrate 302 or 303 is wet-cleaned with a brush (e.g., perlon) and hot water. In some cases a detergent (e.g., Alconox™, Citrajet™, Detojet™, Transene™, and Basic H™), surfactant, pH adjusting agent, and other cleaning chemistries are used to clean and remove unwanted contaminants and particles from the substrate surface. A water re-circulation system recycles the hot water flow. Next, in a final rinse section of the cleaning module 206, the substrate 302 or 303 is rinsed with water at ambient temperature to remove any traces of contaminants. Finally, in a drying section, an air blower is used to dry the substrate 302 or 303 with hot air. In one configuration a deionization bar is used to remove the electrical charge from the substrate 302 or 303 at the completion of the drying process.

In the next step, or step 108, separate cells are electrically isolated from one another via scribing processes. Contamination particles on the TCO surface and/or on the bare glass surface can interfere with the scribing procedure. In laser scribing, for example, if the laser beam runs across a particle, it may be unable to scribe a continuous line, resulting in a short circuit between cells. In addition, any particulate debris present in the scribed pattern and/or on the TCO of the cells after scribing can cause shunting and non-uniformities between layers. Therefore, a well-defined and well-maintained process is generally needed to ensure that contamination is removed throughout the production process. In one embodiment, the cleaning module 206 is available from the Energy and Environment Solutions division of Applied Materials in Santa Clara, Calif.

Referring to FIGS. 1 and 2, in one embodiment, prior to performing step 108 the substrates 302 are transported to a front end processing module (not illustrated in FIG. 2) in which a front contact formation process, or step 107, is performed on the substrate 302. In one embodiment, the front end processing module is similar to the processing module 218 discussed below. In step 107, the one or more substrate front contact formation steps may include one or more preparation, etching, and/or material deposition steps to form the front contact regions on a bare solar cell substrate 302. In one embodiment, step 107 comprises one or more PVD steps that are used to form the front contact region on a surface of the substrate 302. In one embodiment, the front contact region contains a transparent conducting oxide (TCO) layer that may contain metal element selected from a group consisting of zinc (Zn), aluminum (Al), indium (In), and tin (Sn). In one example, a zinc oxide (ZnO) is used to form at least a portion of the front contact layer. In one embodiment, the front end processing module is an ATON™ PVD 5.7 tool available from Applied Materials in Santa Clara, Calif. in which one or more processing steps are performed to deposit the front contact region. In another embodiment, one or more CVD steps are used to form the front contact region on a surface of the substrate 302.

Next the device substrate 303 is transported to the scribe module 208 in which step 108, or a front contact isolation step, is performed on the device substrate 303 to electrically isolate different regions of the device substrate 303 surface from each other. In step 108, material is removed from the device substrate 303 surface by use of a material removal step, such as a laser ablation process. The success criteria for step 108 are to achieve good cell-to-cell and cell-to-edge isolation while minimizing the scribe area.

In one embodiment, a Nd:vanadate (Nd:YVO$_4$) laser source is used ablate material from the device substrate 303 surface to form lines that electrically isolate one region of the device substrate 303 from the next. In one embodiment, the laser scribe process performed during step 108 uses a 1064 nm wavelength pulsed laser to pattern the material disposed on the substrate 302 to isolate each of the individual cells (e.g., reference cells 382A and 382B) that make up the solar cell 300. In one embodiment, a 5.7 m$^2$ substrate laser scribe module available from Applied Materials, Inc. of Santa Clara, Calif. is used to provide simple reliable optics and substrate motion for accurate electrical isolation of regions of the device substrate 303 surface. In another embodiment, a water jet cutting tool or diamond scribe is used to isolate the various regions on the surface of the device substrate 303.

It may be desirable to assure that the temperature of the device substrates 303 entering the scribe module 208 are at a temperature in a range between about 20° C. and about 26° C. by use of an active temperature control hardware assembly that may contain a resistive heater and/or chiller components (e.g., heat exchanger, thermoelectric device). In one embodiment, it is desirable to control the device substrate 303 temperature to about 25+/−0.5° C.

Next the device substrate 303 is transported to the cleaning module 210 in which step 110, or a pre-deposition substrate cleaning step, is performed on the device substrate 303 to remove any contaminants found on the surface of the device substrate 303 after performing the cell isolation step (step 108). Typically, the cleaning module 210 uses wet chemical scrubbing and rinsing steps to remove any undesirable contaminants found on the device substrate 303 surface after performing the cell isolation step. In one embodiment, a cleaning process similar to the processes described in step 106 above is performed on the device substrate 303 to remove any contaminants on the surface(s) of the device substrate 303.

Next, the device substrate 303 is transported to the processing module 212 in which step 112, which comprises one or more photoabsorber deposition steps, is performed on the device substrate 303. In step 112, the one or more photoabsorber deposition steps may include one or more preparation, etching, and/or material deposition steps that are used to form the various regions of the solar cell device. Step 112 generally comprises a series of sub-processing steps that are used to form one or more p-i-n junctions. In one embodiment, the one or more p-i-n junctions comprise amorphous silicon and/or microcrystalline silicon materials. In general, the one or more processing steps are performed in one or more cluster tools (e.g., cluster tools 212A-212D) found in the processing module 212 to form one or more layers in the solar cell device formed on the device substrate 303. In one embodiment, the device substrate 303 is transferred to an accumulator 211A prior to being transferred to one or more of the cluster tools 212A-212D. In one embodiment, in cases where the solar cell device is formed to include multiple junctions, such as the tandem junction solar cell 300 illustrated in FIG. 3B, the cluster tool 212A in the processing module 212 is adapted to form the first p-i-n junction 320 and cluster tools 212B-212D are configured to form the second p-i-n junction 330.

In one embodiment of the process sequence 100, a cool down step, or step 113, is performed after step 112 has been performed. The cool down step is generally used to stabilize the temperature of the device substrate 303 to assure that the processing conditions seen by each device substrate 303 in the subsequent processing steps are repeatable. Generally, the temperature of the device substrate 303 exiting the processing module 212 could vary by many degrees Celsius and exceed a temperature of 50° C., which can cause variability in the subsequent processing steps and solar cell performance.

In one embodiment, the cool down step 113 is performed in one or more of the substrate supporting positions found in one or more accumulators 211. In one configuration of the production line, as shown in FIG. 2, the processed device substrates 303 may be positioned in one of the accumulators 211B for a desired period of time to control the temperature of the device substrate 303. In one embodiment, the system controller 290 is used to control the positioning, timing, and movement of the device substrates 303 through the accumulator(s) 211 to control the temperature of the device substrates 303 before proceeding down stream through the production line.

Next, the device substrate 303 is transported to the scribe module 214 in which step 114, or the interconnect formation step, is performed on the device substrate 303 to electrically isolate various regions of the device substrate 303 surface from each other. In step 114, material is removed from the device substrate 303 surface by use of a material removal step, such as a laser ablation process. In one embodiment, an Nd:vanadate (Nd:YVO$_4$) laser source is used ablate material from the substrate surface to form lines that electrically isolate one solar cell from the next. In one embodiment, a 5.7 m$^2$ substrate laser scribe module available from Applied Materials, Inc. is used to perform the accurate scribing process. In one embodiment, the laser scribe process performed during step 108 uses a 532 nm wavelength pulsed laser to pattern the material disposed on the device substrate 303 to isolate the individual cells that make up the solar cell 300. As shown in FIG. 3E, in one embodiment, the trench 381B is formed in the first p-i-n junction 320 layers by use of a laser scribing process. In another embodiment, a water jet cutting tool or diamond scribe is used to isolate the various regions on the surface of the solar cell.

It may be desirable to assure that the temperature of the device substrates 303 entering the scribe module 214 are at a temperature in a range between about 20° C. and about 26° C. by use of an active temperature control hardware assembly that may contain a resistive heater and/or chiller components (e.g., heat exchanger, thermoelectric device). In one embodiment, it is desirable to control the substrate temperature to about 25+/−0.5° C.

In one embodiment, the solar cell production line 200 has at least one accumulator 211 positioned after the scribe module(s) 214. During production accumulators 211C may be used to provide a ready supply of substrates to the processing module 218, and/or provide a collection area where substrates coming from the processing module 212 can be stored if the processing module 218 goes down or can not keep up with the throughput of the scribe module(s) 214. In one embodiment it is generally desirable to monitor and/or actively control the temperature of the substrates exiting the accumulators 211C to assure that the results of the back contact formation step 120 are repeatable. In one aspect, it is desirable to assure that the temperature of the substrates exiting the accumulators 211C or arriving at the processing module 218 are at a temperature in a range between about 20° C. and about 26° C. In one embodiment, it is desirable to control the substrate temperature to about 25+/−0.5° C. In one embodiment, it is desirable to position one or more accumulators 211C that are able to retain at least about 80 substrates.

Next, the device substrate 303 is transported to the processing module 218 in which one or more substrate back contact formation steps, or step 118, are performed on the device substrate 303. In step 118, the one or more substrate back contact formation steps may include one or more preparation, etching, and/or material deposition steps that are used to form the back contact regions of the solar cell device. In one embodiment, step 118 generally comprises one or more PVD steps that are used to form the back contact layer 350 on the surface of the device substrate 303. In one embodiment, the one or more PVD steps are used to form a back contact region that contains a metal layer selected from a group consisting of zinc (Zn), tin (Sn), aluminum (Al), copper (Cu), silver (Ag), nickel (Ni), vanadium (V), molybdenum (Mo), and conductive carbon. In one example, a zinc oxide (ZnO) or nickel vanadium alloy (NiV) is used to form at least a portion of the back contact layer 305. In one embodiment, the one or more processing steps are performed using an ATON™ PVD 5.7 tool available from Applied Materials in Santa Clara, Calif. In another embodiment, one or more CVD steps are used to form the back contact layer 350 on the surface of the device substrate 303.

In one embodiment, the solar cell production line 200 has at least one accumulator 211 positioned after the processing module 218. During production, the accumulators 211D may be used to provide a ready supply of substrates to the scribe modules 220, and/or provide a collection area where substrates coming from the processing module 218 can be stored if the scribe modules 220 go down or can not keep up with the throughput of the processing module 218. In one embodiment it is generally desirable to monitor and/or actively control the temperature of the substrates exiting the accumulators 211D to assure that the results of the back contact formation step 120 are repeatable. In one aspect, it is desirable to assure that the temperature of the substrates exiting the accumulators 211D or arriving at the scribe module 220 are at a temperature in a range between about 20° C. and about 26° C. In one embodiment, it is desirable to control the substrate temperature to about 25+/−0.5° C. In one embodiment, it is desirable to position one or more accumulators 211C that are able to retain at least about 80 substrates.

Next, the device substrate 303 is transported to the scribe module 220 in which step 120, or a back contact isolation step, is performed on the device substrate 303 to electrically isolate the plurality of solar cells contained on the substrate surface from each other. In step 120, material is removed from the substrate surface by use of a material removal step, such as a laser ablation process. In one embodiment, a Nd:vanadate (Nd:YVO$_4$) laser source is used ablate material from the device substrate 303 surface to form lines that electrically isolate one solar cell from the next. In one embodiment, a 5.7 m$^2$ substrate laser scribe module, available from Applied Materials, Inc., is used to accurately scribe the desired regions of the device substrate 303. In one embodiment, the laser scribe process performed during step 120 uses a 532 nm wavelength pulsed laser to pattern the material disposed on the device substrate 303 to isolate the individual cells that make up the solar cell 300. As shown in FIG. 3E, in one embodiment, the trench 381C is formed in the first p-i-n junction 320 and back contact layer 350 by use of a laser scribing process.

Next, the device substrate 303 is transported to the quality assurance module 222 in which step 122, or quality assurance and/or shunt removal steps, are performed on the device substrate 303 to assure that the devices formed on the substrate surface meet a desired quality standard and in some cases correct defects in the formed device. In step 122, a probing device is used to measure the quality and material properties of the formed solar cell device by use of one or more substrate contacting probes.

In one embodiment, the quality assurance module 222 projects a low level of light at the p-i-n junction(s) of the solar cell and uses the one more probes to measure the output of the cell to determine the electrical characteristics of the formed solar cell device(s). If the module detects a defect in the formed device, it can take corrective actions to fix the defects in the formed solar cells on the device substrate 303. In one embodiment, if a short or other similar defect is found, it may be desirable to create a reverse bias between regions on the substrate surface to control and or correct one or more of the defectively formed regions of the solar cell device. During the correction process the reverse bias generally delivers a voltage high enough to cause the defects in the solar cells to be corrected. In one example, if a short is found between supposedly isolated regions of the device substrate 303 the magnitude of the reverse bias may be raised to a level that causes the conductive elements in areas between the isolated regions to change phase, decompose, or become altered in some way to eliminate or reduce the magnitude of the electrical short.

In one embodiment of the process sequence 100, the quality assurance module 222 and factory automation system are used together to resolve quality issues found in a formed device substrate 303 during the quality assurance testing. In one case, a device substrate 303 may be sent back upstream in the processing sequence to allow one or more of the fabrication steps to be re-performed on the device substrate 303 (e.g., back contact isolation step (step 120)) to correct one or more quality issues with the processed device substrate 303.

Next, the device substrate 303 is optionally transported to the substrate sectioning module 224 in which a substrate sectioning step 124 is used to cut the device substrate 303 into a plurality of smaller device substrates 303 to form a plurality of smaller solar cell devices. In one embodiment of step 124, the device substrate 303 is inserted into substrate sectioning module 224 that uses a CNC glass cutting tool to accurately cut and section the device substrate 303 to form solar cell devices that are a desired size. In one embodiment, the device substrate 303 is inserted into the sectioning module 224 that uses a glass scribing tool to accurately score the surface of the device substrate 303. The device substrate 303 is then broken along the scored lines to produce the desired size and number of sections needed for the completion of the solar cell devices.

In one embodiment, steps 102-122 can be configured to use equipment that is adapted to perform process steps on large device substrates 303, such as 2200 mm×2600 mm×3 mm glass device substrates 303, and steps 124 onward can be adapted to fabricate various smaller sized solar cell devices with no additional equipment required. In another embodiment, step 124 is positioned in the process sequence 100 prior to step 122 so that the initially large device substrate 303 can be sectioned to form multiple individual solar cells that are then tested and characterized one at a time or as a group (i.e., two or more at a time). In this case, steps 102-121 are configured to use equipment that is adapted to perform process steps on large device substrates 303, such as 2200 mm×2600 mm×3 mm glass substrates, and steps 124 and 122 onward are adapted to fabricate various smaller sized modules with no additional equipment required.

Referring back to FIGS. 1 and 2, the device substrate 303 is next transported to the seamer/edge deletion module 226 in which a substrate surface and edge preparation step 126 is used to prepare various surfaces of the device substrate 303 to prevent yield issues later on in the process. In one embodiment of step 126, the device substrate 303 is inserted into seamer/edge deletion module 226 to prepare the edges of the device substrate 303 to shape and prepare the edges of the device substrate 303. Damage to the device substrate 303 edge can affect the device yield and the cost to produce a usable solar cell device. In another embodiment, the seamer/edge deletion module 226 is used to remove deposited material from the edge of the device substrate 303 (e.g., 10 mm) to provide a region that can be used to form a reliable seal between the device substrate 303 and the backside glass (i.e., steps 134-136 discussed below). Material removal from the edge of the device substrate 303 may also be useful to prevent electrical shorts in the final formed solar cell.

In one embodiment, a grinding wheel is used to grind the deposited material from the edge regions of the device substrate 303. In another embodiment, dual grinding wheels are used to remove the deposited material from the edge of the device substrate 303. In yet another embodiment, grit blasting or laser ablation techniques are used to remove the deposited material from the edge of the device substrate 303. In one embodiment, one or more grinding wheels are preferred over blasting techniques in order to reduce the amount of potentially contaminating particles that may be introduced by grit blasting. In one aspect, the seamer/edge deletion module 226 is used to round or bevel the edges of the device substrate 303 by use of shaped grinding wheels, angled and aligned belt sanders, and/or abrasive wheels. A more detailed description of an exemplary seamer/edge deletion module 226 is presented below in the section entitled, "Edge Deletion Module and Processes."

Next the device substrate 303 is transported to the prescreen module 228 in which optional pre-screen steps 128 are performed on the device substrate 303 to assure that the devices formed on the substrate surface meet a desired quality standard. In step 128, a light emitting source and probing device are used to measure the output of the formed solar cell device by use of one or more substrate contacting probes. If the module 228 detects a defect in the formed device it can take corrective actions or the solar cell can be scrapped.

Next the device substrate 303 is transported to the cleaning module 230 in which step 130, or a pre-lamination substrate cleaning step, is performed on the device substrate 303 to remove any contaminants found on the surface of the substrates 303 after performing steps 122-128. Typically, the cleaning module 230 uses wet chemical scrubbing and rinsing steps to remove any undesirable contaminants found on the substrate surface after performing the cell isolation step. In one embodiment, a cleaning process similar to the processes described in step 106 is performed on the substrate 303 to remove any contaminants on the surface(s) of the substrate 303.

Next the substrate 303 is transported to a bonding wire attach module 231 in which step 131, or a bonding wire attach step, is performed on the substrate 303. Step 131 is used to attach the various wires/leads required to connect the various external electrical components to the formed solar cell device. Typically, the bonding wire attach module 231 is an automated wire bonding tool that reliably and quickly forms the numerous interconnects that are often required to form the large solar cells formed in the production line 200.

In one embodiment, the bonding wire attach module 231 is used to form the side-buss 355 (FIG. 3C) and cross-buss 356 on the formed back contact region (step 118). In this configuration the side-buss 355 may be a conductive material that can be affixed, bonded, and/or fused to the back contact layer 350 found in the back contact region to form a good electrical contact. In one embodiment, the side-buss 355 and cross-buss 356 each comprise a metal strip, such as copper tape, a nickel coated silver ribbon, a silver coated nickel ribbon, a tin coated copper ribbon, a nickel coated copper ribbon, or other conductive material that can carry the current delivered by the solar cell and be reliably bonded to the metal layer in the back contact region. In one embodiment, the metal strip is between about 2 mm and about 10 mm wide and between about 1 mm and about 3 mm thick.

The cross-buss 356, which is electrically connected to the side-buss 355 at the junctions, can be electrically isolated from the back contact layer(s) of the solar cell by use of an insulating material 357, such as an insulating tape. The ends of each of the cross-busses 356 generally have one or more leads that are used to connect the side-buss 355 and the cross-buss 356 to the electrical connections found in a junction box 370, which is used to connect the formed solar cell to the other external electrical components.

In the next step, step 132, a bonding material 360 (FIG. 3D) and "back glass" substrate 361 are prepared for delivery into the solar cell formation process (i.e., process sequence 100). The preparation process is performed in the glass lay-up module 232, which comprises a material preparation module 232A, a glass loading module 232B, and a glass cleaning module 232C. The back glass substrate 361 is bonded onto the device substrate 303 formed in steps 102-130 above by use of a laminating process (step 134 discussed below). In one embodiment of step 132, a polymeric material is prepared to be placed between the back glass substrate 361 and the deposited layers on the device substrate 303 to form a hermetic seal to prevent the environment from attacking the solar cell during its life.

Referring to FIG. 2, step 132 comprises a series of substeps in which a bonding material 360 is prepared in the material preparation module 232A, the bonding material 360 is then placed over the device substrate 303, the back glass substrate 361 is loaded into the loading module 232B and washed by the cleaning module 232C, and the back glass substrate 361 is then placed over the bonding material 360 and the device substrate 303.

In one embodiment, the material preparation module 232A is adapted to receive the bonding material 360 in a sheet form and perform one or more cutting operations to provide a bonding material, such as Polyvinyl Butyral (PVB) or Ethylene Vinyl Acetate (EVA) sized to form a reliable seal between the backside glass and the solar cells formed on the device substrate 303. In general, when using bonding materials 360 that are polymeric, it is desirable to control the temperature (e.g., 16-18° C.) and relative humidity (e.g., RH 20-22%) of the solar cell production line 200 where the bonding material 360 is stored and integrated into the solar cell device to assure that the attributes of the bond formed in the bonding module 234 are repeatable and the dimensions of the polymeric material are stable. It is generally desirable to store the bonding material prior to use in temperature and humidity controlled area (e.g., T=6-8° C.; RH=20-22%).

The tolerance stack up of the various components in the bonded device (Step 134) can be an issue when forming large solar cells. Therefore, accurate control of the bonding material properties and tolerances of the cutting process assure that a reliable hermetic seal is formed. In one embodiment, PVB may be used to advantage due to its UV stability, moisture resistance, thermal cycling, good US fire rating, compliance with Intl Building Code, low cost, and reworkable thermoplastic properties.

In one part of step 132, the bonding material 360 is transported and positioned over the back contact layer 350, the side-buss 355 (FIG. 3C), and the cross-buss 356 (FIG. 3C) elements of the device substrate 303 using an automated robotic device. The device substrate 303 and bonding material 360 are then positioned to receive a back glass substrate 361, which can be placed thereon by use of the same automated robotic device used to position the bonding material 360, or a second automated robotic device.

In one embodiment, prior to positioning the back glass substrate 361 over the bonding material 360, one or more preparation steps are performed to the back glass substrate 361 to assure that subsequent sealing processes and final solar product are desirably formed. In one case, the back glass substrate 361 is received in a "raw" state where the edges, overall size, and/or cleanliness of the substrate 361 are not well controlled. Receiving "raw" substrates reduces the cost to prepare and store substrates prior to forming a solar device and thus reduces the solar cell device cost, facilities costs, and production costs of the finally formed solar cell device. In one embodiment of step 132, the back glass substrate 361 surfaces and edges are prepared in a seaming module (e.g., seamer 204) prior to performing the back glass substrate cleaning step. In the next sub-step of step 132, the back glass substrate 361 is transported to the cleaning module 232C in which a substrate cleaning step is performed on the substrate 361 to remove any contaminants found on the surface of the substrate 361. Common contaminants may include materials deposited on the substrate 361 during the substrate forming process (e.g., glass manufacturing process) and/or during shipping of the substrates 361. Typically, the cleaning module 232C uses wet chemical scrubbing and rinsing steps to remove any undesirable contaminants as discussed above. The prepared back glass substrate 361 is then positioned over the bonding material and the device substrate 303 by use of an automated robotic device.

Next the device substrate 303, the back glass substrate 361, and the bonding material 360 are transported to the bonding module 234 in which step 134, or lamination steps are performed to bond the backside glass substrate 361 to the device substrate formed in steps 102-130 discussed above. In step 134, a bonding material 360, such as Polyvinyl Butyral (PVB) or Ethylene Vinyl Acetate (EVA), is sandwiched between the backside glass substrate 361 and the device substrate 303. Heat and pressure are applied to the structure to form a bonded and sealed device using various heating elements and other devices found in the bonding module 234. The device substrate 303, the back glass substrate 361, and the bonding material 360 thus form a composite solar cell structure 304 (FIG. 3D) that at least partially encapsulates the active regions of the solar cell device. In one embodiment, at least one hole formed in the back glass substrate 361 remains at least partially uncovered by the bonding material 360 to allow portions of the cross-buss 356 or the side buss 355 to remain exposed so that electrical connections can be made to these regions of the solar cell structure 304 in future steps (i.e., step 138).

Next the composite solar cell structure 304 is transported to the autoclave module 236 in which step 136, or autoclave steps are performed on the composite solar cell structure 304 to remove trapped gasses in the bonded structure and assure that a good bond is formed during step 134. In step 134, a bonded solar cell structure 304 is inserted in the processing region of the autoclave module where heat and high pressure gases are delivered to reduce the amount of trapped gas and improve the properties of the bond between the device substrate 303, back glass substrate, and bonding material 360. The processes performed in the autoclave are also useful to assure that the stress in the glass and bonding layer (e.g., PVB layer) are more controlled to prevent future failures of the hermetic seal or failure of the glass due to the stress induced during the bonding/lamination process. In one embodiment, it may be desirable to heat the device substrate 303, back glass substrate 361, and bonding material 360 to a temperature that causes stress relaxation in one or more of the components in the formed solar cell structure 304.

Next the solar cell structure 304 is transported to the junction box attachment module 238 in which junction box attachment steps 138 are performed on the formed solar cell structure 304. The junction box attachment module 238, used during step 138, is used to install a junction box 370 (FIG. 3C) on a partially formed solar cell. The installed junction box 370 acts as an interface between the external electrical components that will connect to the formed solar cell, such as other solar cells or a power grid, and the internal electrical connections points, such as the leads, formed during step 131. In one embodiment, the junction box 370 contains one or more junction box terminals 371, 372 so that the formed solar cell can be easily and systematically connected to other external devices to deliver the generated electrical power.

Next the solar cell structure 304 is transported to the device testing module 240 in which device screening and analysis steps 140 are performed on the solar cell structure 304 to assure that the devices formed on the solar cell structure 304 surface meet desired quality standards. In one embodiment, the device testing module 240 is a solar simulator module that is used to qualify and test the output of the one or more formed solar cells. In step 140, a light emitting source and probing device are used to measure the output of the formed solar cell device by use of one or more automated components adapted to make electrical contact with terminals in the junction box 370. If the module detects a defect in the formed device it can take corrective actions or the solar cell can be scrapped.

Next the solar cell structure 304 is transported to the support structure module 241 in which support structure mounting steps 141 are performed on the solar cell structure 304 to provide a complete solar cell device that has one or more mounting elements attached to the solar cell structure 304 formed using steps 102-140 to a complete solar cell device that can easily be mounted and rapidly installed at a customer's site.

Next the solar cell structure 304 is transported to the unload module 242 in which step 142, or device unload steps are performed on the substrate to remove the formed solar cells from the solar cell production line 200.

In one embodiment of the solar cell production line 200, one or more regions in the production line are positioned in a clean room environment to reduce or prevent contamination from affecting the solar cell device yield and useable lifetime. In one embodiment, as shown in FIG. 2, a class 10,000 clean room space 250 is placed around the modules used to perform steps 108-118 and steps 130-134.

Edge Deletion Module and Processes

The seamer/edge deletion module 226 and processing sequence, performed during the substrate surface and edge preparation step 126, are used to remove material from all four edges of the variable sized device substrate 303. The material removed in this process may include soft metallic material layers as well as hard TCO and silicon containing layers, which have been found to greatly reduce the life of conventional belt type devices due to the soft material accumulation on the abrasive portion of the belt surface that causes the belt to lose its abrasive cutting capability. This region of material removal provides electrical insulation of the active cells in the solar module. Additionally, edge deletion provides a region on which a reliable seal can be formed to prevent the premature degradation of the active regions of the formed solar cell device due to the encroachment of the outside environment.

Figure 4:
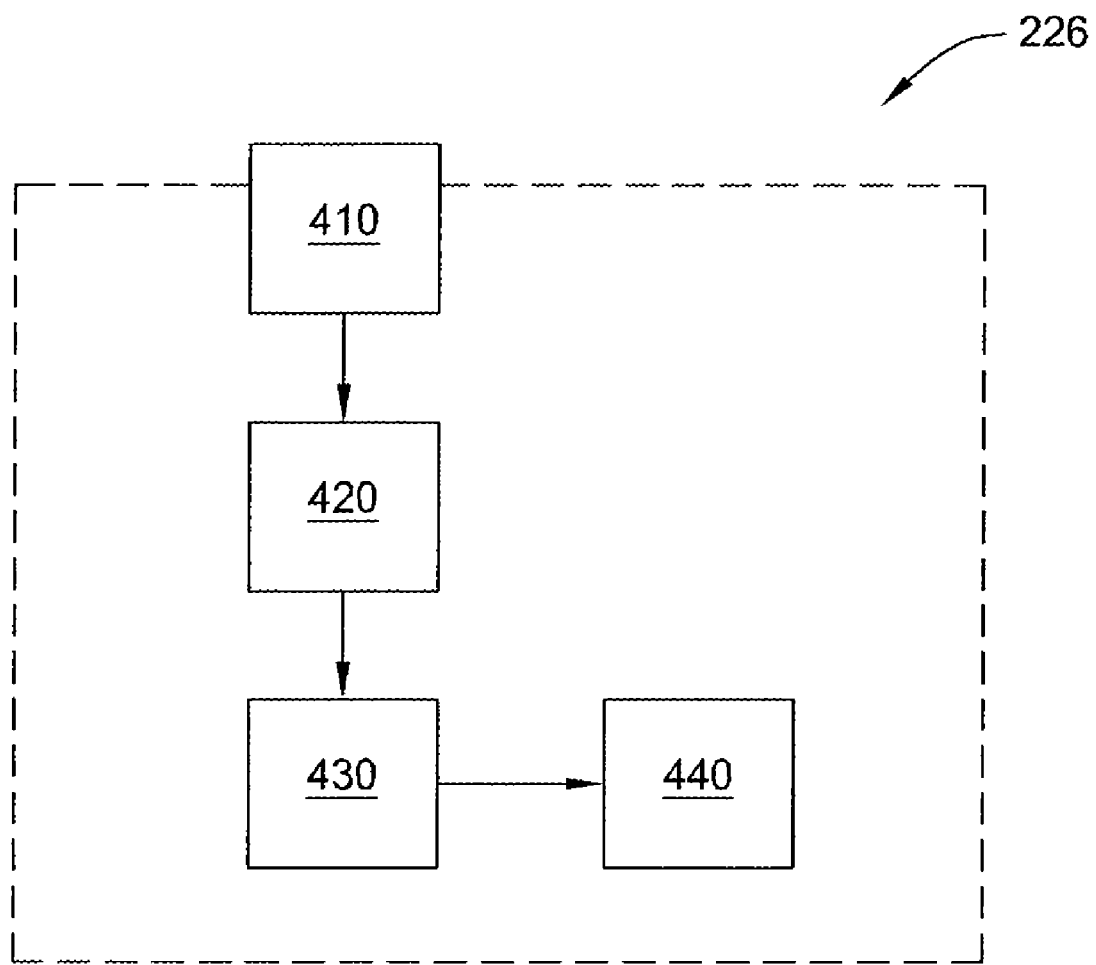
FIG. 4 illustrates a schematic plan view of one embodiment of an edge deletion module according to the present invention.

FIG. 4 is a schematic, plan view of one embodiment of the seamer/edge deletion module 226. An inlet conveyor 410, such as the automation device 281, transports the device substrate 303 into a first edge deletion station 420. In this first station, two opposing side edges of the device substrate 303 are processed, and material is removed therefrom. Next, the device substrate 303 enters a cross transfer station 430. At this point, the device substrate 303 is fed into a second edge deletion station 440. In this station, the remaining two opposing side edges of the device substrate 303 are processed, and material is removed therefrom. At this point, the substrate surface and edge preparation step 126 is complete, and the solar cell device exits the seamer/edge deletion module 226 for further processing as previously described.

Figure 5:
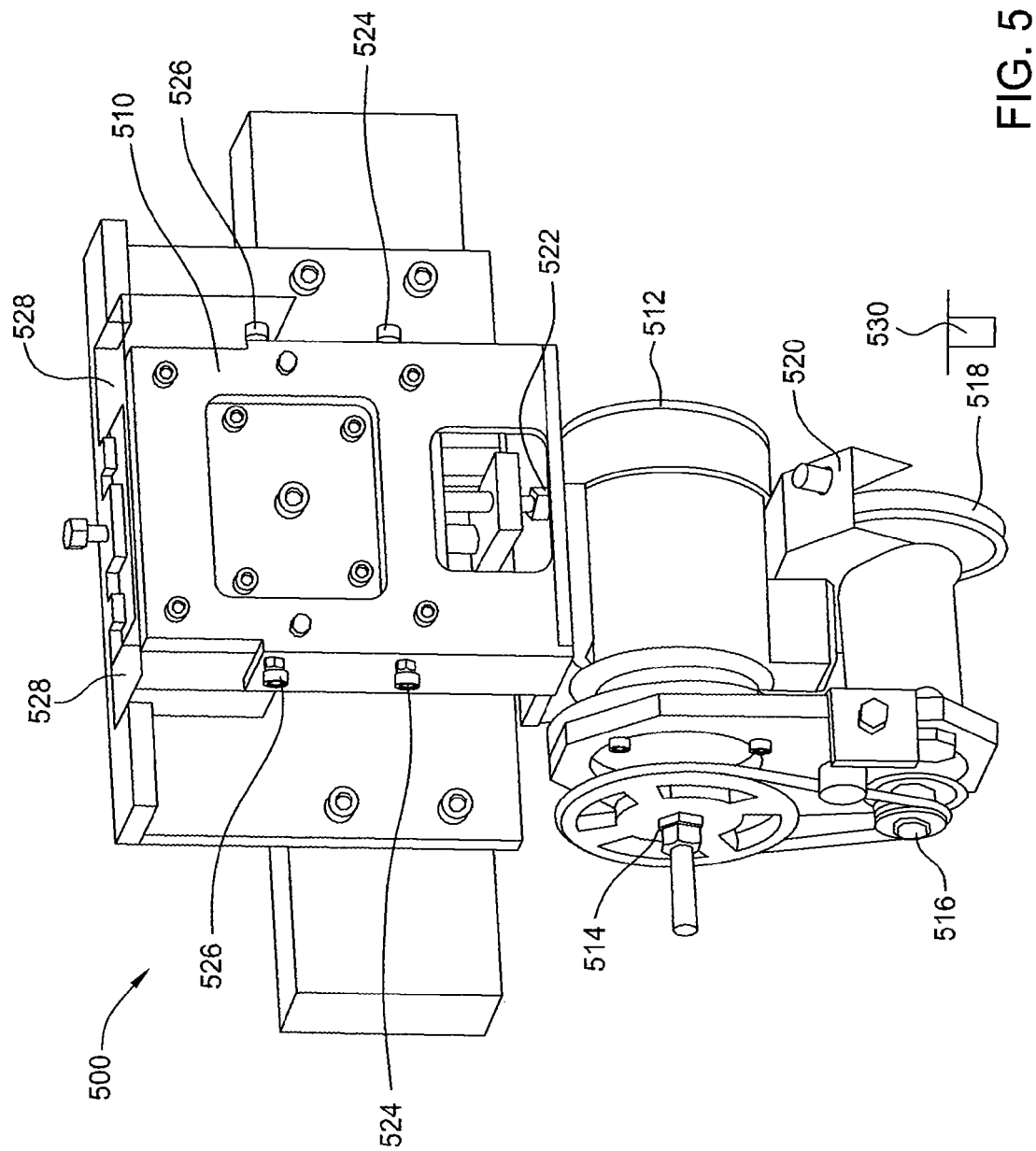
FIG. 5 is a partial, schematic, modified isometric view of one embodiment of an edge deletion grinding wheel device according to the present invention.

FIG. 5 is a partial, schematic, modified isometric view of one embodiment of an edge deletion grinding wheel device 500 according to the present invention. Generally, the device 500 includes a mounting structure 510, a motor 512, a motor pulley 514, a grinding wheel pulley 516, a grinding wheel 518, and a guard unit 520. The mounting structure 510 is typically mounted to a cross member within the first edge deletion station 420 or the second edge deletion station 440 as described below. The mounting structure 510 may include a vertical adjustment member 522, a horizontal adjustment member 524, and an angular alignment member 526. Exemplary embodiments of the vertical adjustment member 522, the horizontal adjustment member 524, and the angular alignment member 526 may comprise dual adjustment mechanisms, such as coarse and fine threaded adjustment screws. The vertical adjustment member 522, the horizontal adjustment member 524, and the angular alignment member 526 may be used for setting initial alignment of the edge deletion grinding wheel device 500 for seaming and edge deletion of the device substrate 303.

Another feature that may be included in the edge deletion grinding wheel device 500 includes constant pressure members 528. The constant pressure members 528 may comprise a mechanical, pneumatic, or hydraulic system of springs and dampers for ensuring the grinding wheel 518 asserts a constant downward pressure onto the device substrate 303 during the edge deletion process regardless of the thickness or the thickness variation of the device substrate 303. Thus, the edge deletion grinding wheel device 500 may remove the same amount of material from the top surface of the device substrate 303 regardless of the thickness or thickness variation of the device substrate 303. In this configuration, the application of a constant downward pressure irrespective of the actual substrate thickness or variation in substrate thickness can also be useful to automatically compensate for wear in the grinding wheel 518. Common factors that can affect the wear of the grinding wheel may include normal wear created by the removal of material from the device substrate 303 and wear caused by cleaning, or "dressing," of the grinding wheel 518, which is discussed below in conjunction with FIG. 8.

In one embodiment, the edge delete grinding wheel device 500 includes a sensor 530 for detecting the height of an incoming device substrate 303. The sensor 530 may be a proximity sensor or a mechanical feeler gauge sensor. In one embodiment, the sensor 530 detects the height of the incoming device substrate 303 and sends this information to a controller, such as a local portion of the system controller 290. Additionally, the diameter of the grinding wheel 518 may be determined, such as by a sensing mechanism 805, which is subsequently described with respect to FIGS. 9A-9C. This combination of information is then used to set a hard stop member within the constant pressure members 528 to limit the depth of the outer circumference of the grinding wheel 518.

In another embodiment, the height of the hard stop member within the constant pressure member 528 is set using information obtained from the sensor 530 and information regarding the height of the grinding wheel 518 obtained from the constant pressure member 528 during grinding of the previous device substrate 303. In this configuration, the height of the grinding wheel 518 is determined while grinding on a first device substrate by detecting the amount of compensation provided by the constant pressure member 528 during the grinding of the first device substrate 303 and comparing the amount of compensation detected with the height of the top surface of the device substrate 303 as detected by the sensor 530. When a second device substrate 303 is detected by the sensor 530, this information is compared with that of the first device substrate 303 to set the hard stop within the constant pressure member 528. The starting height of the grinding wheel 518 is thus set with respect to the incoming device substrate 303 to compensate for any wear in the diameter of the grinding wheel 518. This configuration minimizes or eliminates any ramp up grinding of the leading edge of the incoming device substrate 303 as the constant pressure members 528 adjust to the height of the incoming device substrate 303.

In one alternate embodiment, the constant pressure members 528 may include one or more electric motors, such as a stepper motor. In this embodiment, the constant pressure member 528 extends the grinding wheel in the direction of the surface of the device substrate 303 until a specified resistance is encountered.

Figure 6A:
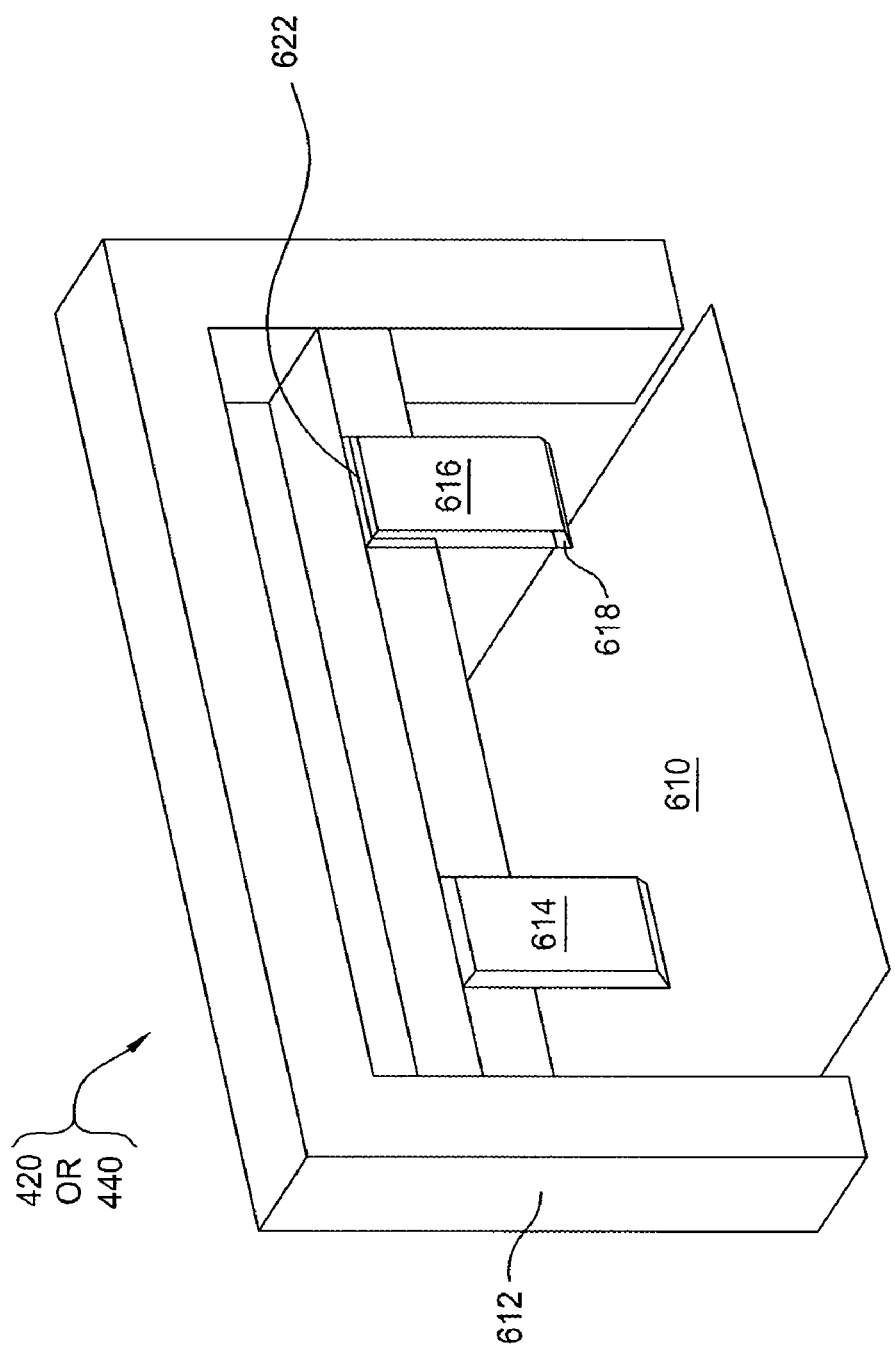
FIG. 6A is a partial, schematic, isometric view of one embodiment of an edge deletion station according to the present invention.

FIG. 6A is a partial, schematic, isometric view of one embodiment of the first edge deletion station 420 or the second edge deletion station 440. The first edge deletion station 420 or the second edge deletion station 440 generally includes a substrate conveyor 610 (such as the automation device 281), a support structure 612, a stationary grinding wheel device 614, and a movable grinding wheel device 616. The stationary grinding wheel device 614 may be fixed at one end of the support structure 612 while the movable grinding wheel device 616 may be disposed at the opposite end of the support structure 612. In operation, the width of the device substrate 303 may be sensed via a position sensor 618 disposed on the movable grinding wheel device 616. The lateral position of the movable grinding wheel device 616 may then be adjusted by the system controller 290, such that the movable grinding wheel device 616 is in position to remove the appropriate amount of material from the top surface edge of the device substrate 303. In one embodiment the system controller 290 receives signals from the sensor 618 and sends signals to an actuator 622 to move the laterally movable grinding wheel device 616. The actuator 622 may comprise one of a number of devices capable of moving the movable grinding wheel device 616 along the support structure 612, such as one or more motors or cylinders. In another embodiment, the movable grinding wheel device 616 may be located manually. Thus, the first edge deletion station 420 or the second edge deletion station 440 may be used to remove material from the top surface edges of the device substrate 303 regardless of the width of the device substrate 303. In one embodiment, both the stationary grinding wheel device 614 and the movable grinding wheel device 616 each include a grinding wheel 518 configured to rotate in a direction opposite to the direction of device substrate 303 movement.

Figure 6B:
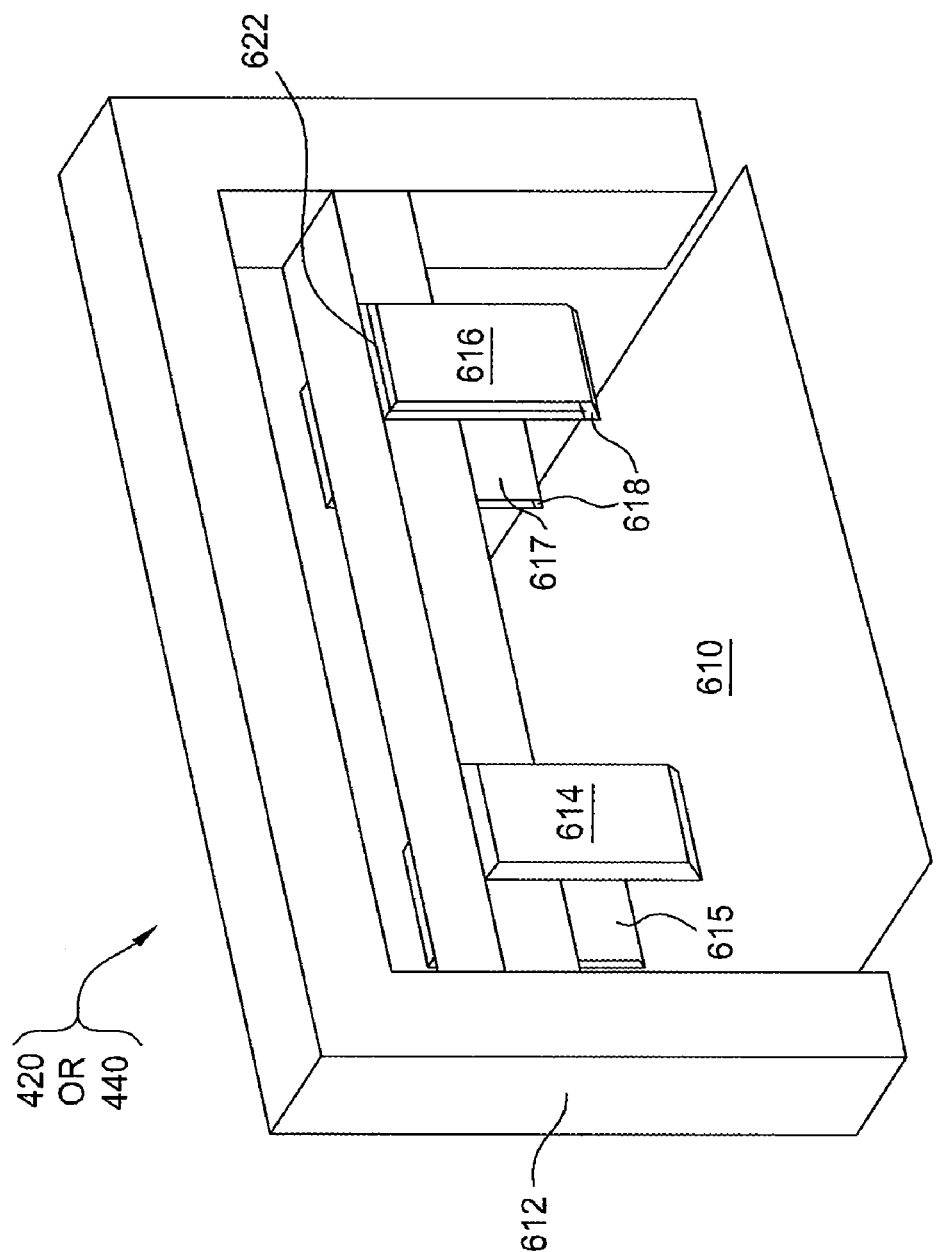
FIG. 6B is a partial, schematic, isometric view of another embodiment of the edge deletion station according to the present invention.

FIG. 6B is a partial, schematic, isometric view of another embodiment of the first edge deletion station 420 or the second edge deletion station 440. In this embodiment, the first edge deletion station 420 or the second edge deletion station 440 generally includes a substrate conveyor 610 (such as the automation device 281), a support structure 612, a first stationary grinding wheel device 614, a second stationary grinding wheel device 615, a first movable grinding wheel device 616, and a second movable grinding wheel device 617. In this embodiment, the first and second stationary grinding wheel devices 614 and 615 may be fixed at one end of the support structure 612. The movable grinding wheel devices 616 and 617 may be disposed at the opposite ends of the support structure 612. In operation, the width of the device substrate 303 may be sensed via a position sensor 618 disposed on one or both of the movable grinding wheel devices 616, 617. The lateral position of the movable grinding wheel devices 616 and 617 may then be adjusted by the system controller 290, such that the movable grinding wheel devices 616 and 617 are in position to remove the appropriate amount of material from the top surface edge of the device. In one embodiment the system controller 290 receives signals from one or more sensors 618 and sends signals to one or more actuators 622 to move the laterally movable grinding wheel devices 616, 617. The actuator 622 may comprise one of a number of devices capable of moving the movable grinding wheel devices 616, 617 along the support structure 612, such as one or more motors or cylinders. In another embodiment, the movable grinding wheel devices 616, 617 may be located manually. Thus, the first edge deletion station 420 or the second edge deletion station 440 may be used to remove material from the top surface edges of the device substrate 303 regardless of the width of the glass substrate. In one embodiment, the first stationary grinding wheel device 614, the second stationary grinding wheel device 615, the first movable grinding wheel device 616, and the second movable grinding wheel device 617 each include a grinding wheel 518 configured to rotate in a direction opposite to the direction of the direction of movement of the device substrate 303.

It is important to note that the movable grinding wheel devices 616 and 617 may be separately controlled or may be coupled together to ensure proper alignment in the surface preparation and edge preparation step 126. Further, this dual wheel configuration may be mounted to a single support structure, as depicted in FIG. 6B, or to a dual support structure (not shown) having two or more wheels that can act independently of the other(s).

Additionally, this dual grinding wheel configuration may be used in a two stage edge removal process. In one embodiment, the first wheel removes the coated material layers from the top surface of the device substrate 303, and the second wheel cleans any remaining material from the surface of the device substrate 303 and enables surface polishing. Thus, the film stack is fully removed, and adequate surface roughness is provided to the edge delete region, which is needed for later lamination. In another embodiment, each wheel removes specific materials. In this embodiment, the properties of each wheel may be tailored to enable efficient removal of only the desired material.

Figure 7:
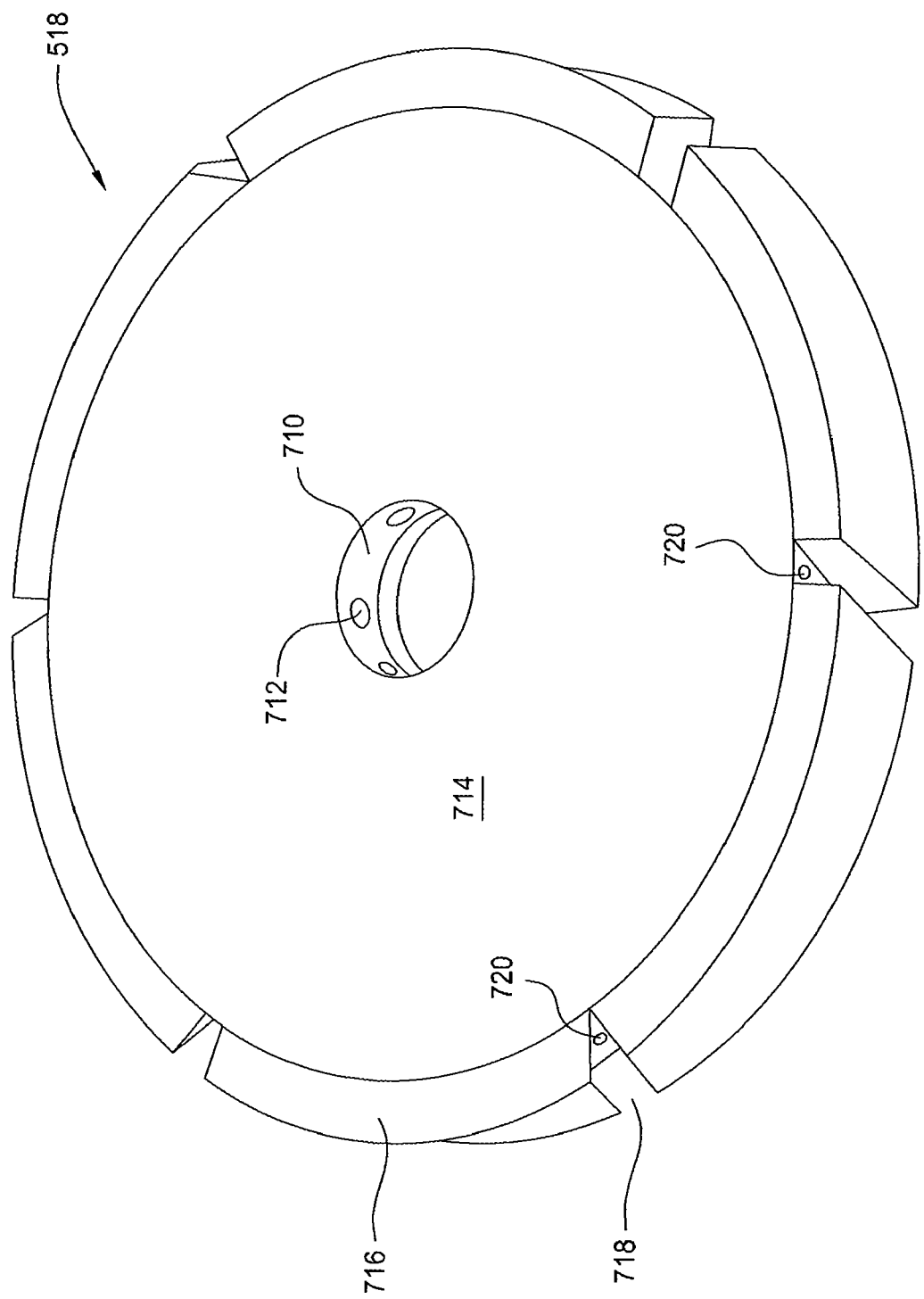
FIG. 7 is a schematic, modified, isometric view of one embodiment of a grinding wheel according to the present invention.

FIG. 7 is a schematic, modified, isometric view of an exemplary embodiment of a grinding wheel 518. The grinding wheel 518 may include an inner circumference 710 having one or more coolant fluid inlets 712. The grinding wheel 518 may further include a body portion 714 and an outer circumference 716. The outer circumference 716 includes the grinding portion of the grinding wheel 518. In one embodiment, the grinding portion of the grinding wheel includes particles with a grit size of from about 100 grit to about 1000 grit. In one embodiment, the grinding portion includes resin bonded diamond particles. Further, the outer circumference may include one or more open slots 718. In this embodiment, a cooling fluid may be introduced into the fluid inlets 712 and travel through the body portion 714 of the grinding wheel 518 to the open slots 718 at the outer circumference 716 via one or more fluid channels 720. Thus, the grinding wheel 518 may deliver coolant needed for the grinding process to the working area and provide space for any soft material accumulation at the open slots 718. This feature may extend the life of the grinding wheel 518, while addressing requirements for soft material removal. In one embodiment, the open slots 718 and fluid channels 720 are equally distributed about the circumference of the grinding wheel 518 to assure rotational balance during grinding operations.

Figure 8:
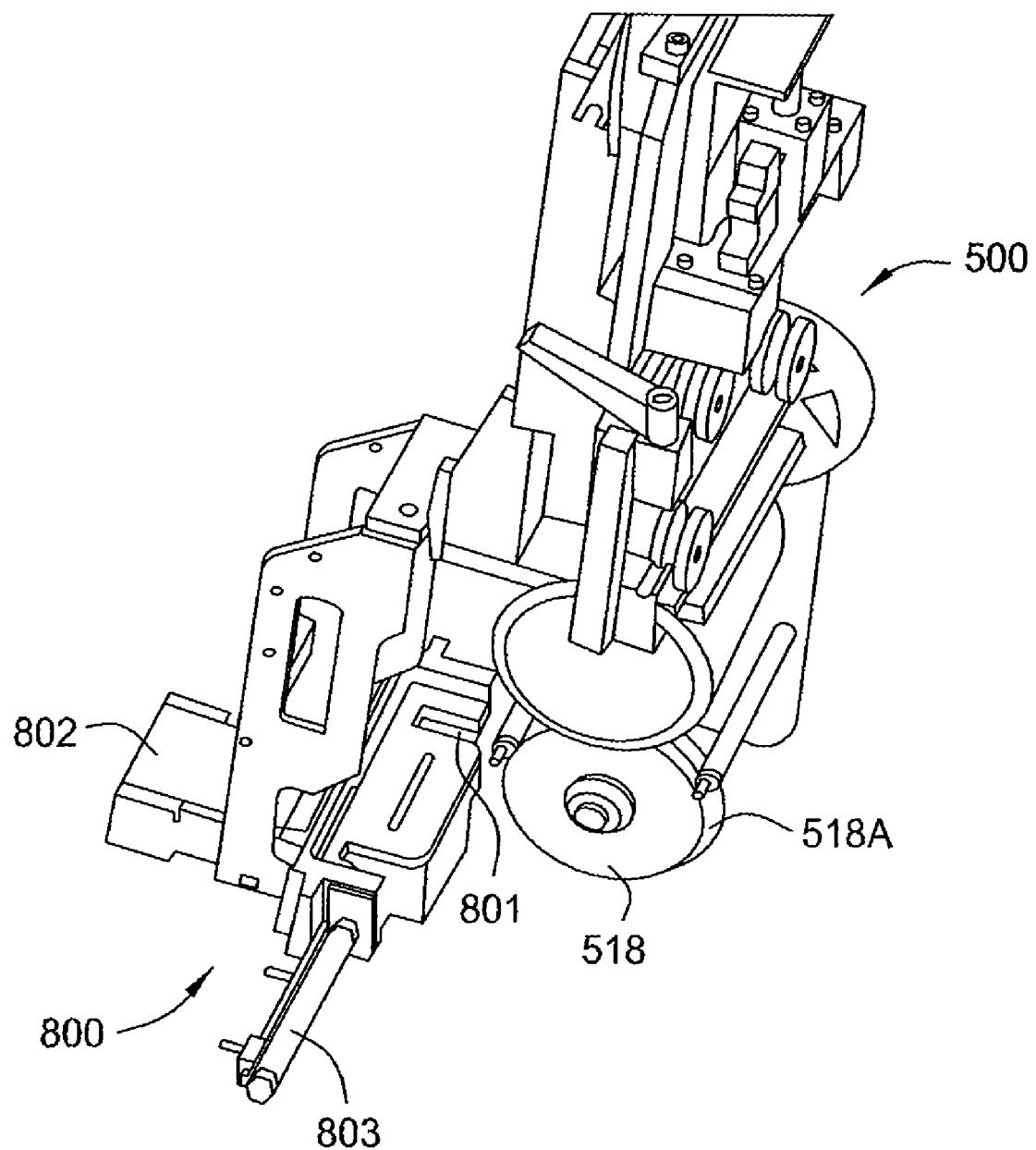
FIG. 8 is an isometric view of one embodiment of an edge deletion grinding wheel device according to the present invention.

FIG. 8 is an isometric view of one embodiment of the edge delete grinding wheel device 500 that contains an auto-dressing device 800. The auto-dressing device 800 is generally used to prepare and maintain the grinding surface 518A of the grinding wheel 518. The auto-dressing device 800 is generally automated so that the grinding surface 518A can be prepared or maintained during one or more phases of step 126, discussed above. In one embodiment of step 126, the seamer/edge deletion module 226 contains one or more dressing operations, which may be performed, for example, during the edge deletion module's idle time, during maintenance activities, between each device substrate 303, or between multiples of device substrates 303 in a production run.

In one embodiment, the auto-dressing device 800 includes a lateral actuator 802 for positioning an auto-dressing element 801 to engage the grinding surface 518A during one or more grinding wheel 518 dressing operations. During dressing operations, the auto-dressing element 801 abrades the surface of the grinding wheel 518 to remove any foreign particles or other adherent material that can affect the performance of the edge delete grinding wheel device 500. In one embodiment, the auto-dressing element 801 may be a steel brush and/or grinding stone. In one embodiment, the auto-dressing element 801 is an abrasive block, which may be comprised of a porous, ceramic material, such as aluminum oxide.

In one embodiment, the lateral actuator 802 is adapted to urge the auto-dressing element 801 against the grinding surface 518A at a controlled force for a desired period of time by use of commands sent from the system controller 290. In one embodiment, the lateral actuator 802 may be a pneumatically or hydraulically actuated cylinder. In another embodiment, the lateral actuator 802 may be an electric motor, such as a stepper motor.

In one embodiment, a longitudinal actuator 803 may advance the auto-dressing element 801 to provide a fresh dressing surface once the previous dressing surface of the auto-dressing element 801 has been consumed by the abrasive action created by the auto-dressing element 801 being urged against the rotating grinding wheel 518 during the one or more dressing operations. The longitudinal actuator 803 may be a pneumatically or hydraulically actuated cylinder, such as a double action cylinder. Alternatively, the longitudinal actuator 803 may be an electric motor. In one embodiment, the longitudinal actuator 803 is an electric motor that is in electrical communication with the system controller 290.

Figure 9A:
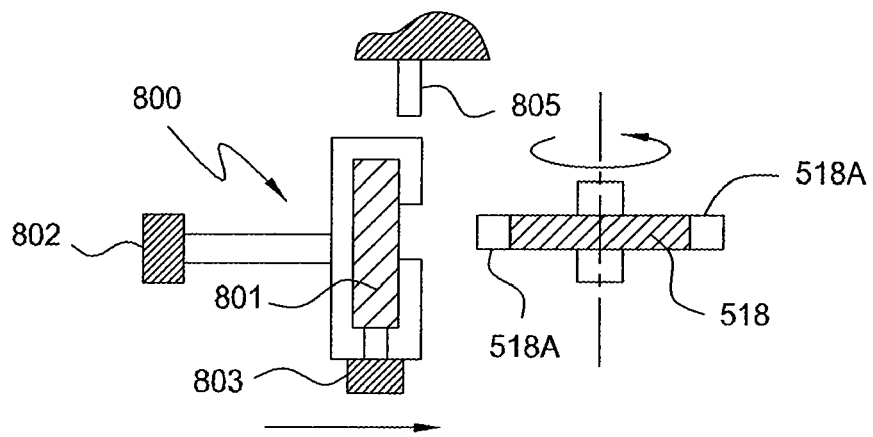
FIGS. 9A-9C are partial schematic top views depicting the general operation of an auto-dressing device according to one embodiment of the present invention.
Figure 9B:
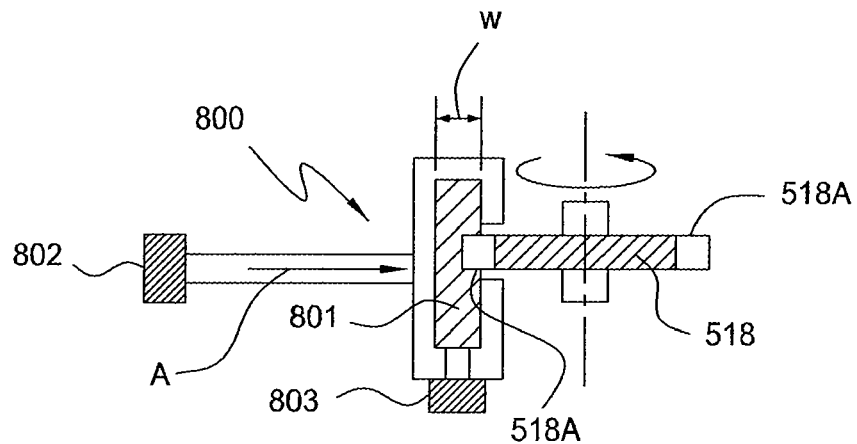
Figure 9C:
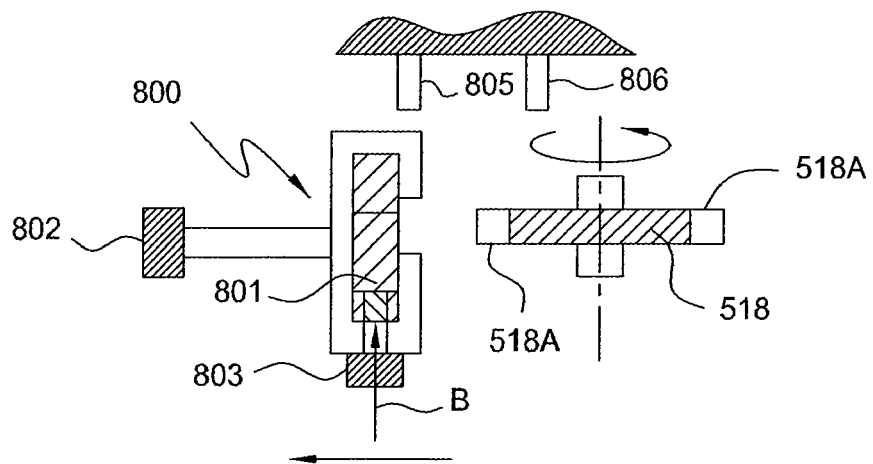

FIGS. 9A-9C are partial, schematic top views depicting the general operation of the auto-dressing device 800. FIG. 9A depicts the auto-dressing element 801 in its home or fully retracted position. In this position, the auto-dressing element 801 is completely clear of the grinding area, allowing grinding wheel 518 to perform substrate grinding operations. A sensing mechanism 805, such as a proximity sensor, may be included to detect when the auto-dressing element 801 is in this home position, and the system controller 290 may be used to only allow substrate grinding operations when the auto-dressing element is in its home position.

As the grinding wheel 518 grinds the substrate surface, the grinding surface 518A of the grinding wheel 518 becomes clogged with particulates, resulting in lowered grinding efficiency. At this point, dressing of the grinding wheel 518 is required.

FIG. 9B depicts the auto-dressing element 801 in a dressing position. During the dressing operation, the lateral actuator 802 advances the auto-dressing element 801 laterally in the direction indicated by the arrow "A". As the auto-dressing element 801 advances, a portion of the grinding surface 518A of the grinding wheel 518 is removed by the abrasion of the auto-dressing element 801 as it is urged against the grinding surfaces 518A. The interaction of the auto-dressing element 801 and the grinding surfaces 518A creates a freshly dressed grinding surface.

In one embodiment, the grinding surface 518A of the grinding wheel 518 is dressed at regular time intervals, such as every hour or the like. In this embodiment, each time the grinding wheel 518 is dressed, the full width "W" of the dressing element 801 may be consumed. In other words, the lateral actuator 802 may advance the auto-dressing element 801 laterally until the grinding wheel 518 grinds through the entire lateral thickness, or width "W", of the auto-dressing element 801.

In another embodiment, the surface 518A of the grinding wheel 518 is dressed at regular use intervals, such as after each grinding operation. In this embodiment, each time the grinding wheel 518 is dressed, only a portion of the width of the auto-dressing element 801 is consumed. In other words, the lateral actuator 802 may advance the auto-dressing element 801 laterally just until the grinding wheel 518 grinds through a set length of the thickness of the auto-dressing element 801, such as 1 mm for a 25 mm wide auto-dressing element. This embodiment may result in a more efficient grinding wheel device 500 than the previous embodiment; however, additional challenges must be overcome.

For instance, over time, the diameter of the grinding wheel 518 decreases due to grinding and dressing operations. Therefore, in order to consume a consistent portion of the thickness of the auto-dressing element 801 for each dressing operation, the distance that the lateral actuator 802 must advance the auto-dressing element 801 from the home position changes. Accordingly, the grinding wheel device 500 may include a feedback loop in communication with and controlled by the system controller 290. The system controller 290 and the lateral actuator 802 can be used to control and monitor the position of the auto-dressing element 801 relative to the grinding wheel 518 to assure that a consistent dressing process occurs at one or more intervals during an automated substrate grinding process.

In one embodiment, sensors or position monitoring elements within the constant pressure member 528 (FIG. 5) may be used to determine the radial loss of the grinding wheel 518 during a grinding operation. This difference may then be used by the system controller 290 to determine the additional distance that the auto-dressing element 801 must be laterally extended by the lateral actuator 802 to compensate for the radial loss of material from the surface 518A by the grinding wheel 518.

Once the entire width of the auto-dressing element 801 is consumed, the auto-dressing element 801 may be manipulated to provide a fresh surface for the next dressing operation. In one embodiment, shown in FIG. 9C, the longitudinal actuator 803 advances the auto-dress element 801 longitudinally in the direction of the arrow "B", a specified distance to allow the grinding wheel 518 to access a new section of the auto-dress element 801. A sensing mechanism 806, such as a proximity sensor, may be included to detect when the auto-dressing element 801 is in the fully extended position, indicating consumption of the full width of the auto-dressing element 801. The system controller 290 may be used to receive a signal from the sensing mechanism 805 and in turn, send commands to the lateral actuator 802 to return the auto-dressing element 801 to the home position. The system controller 290 may then send commands to the longitudinal actuator 803 to advance the auto-dressing element 801 the appropriate distance to present a fresh dressing surface. Therefore, multiple dressing operations may be conducted prior to the full consumption and replacement of the auto-dressing element 801. This results in a more efficient grinding wheel device 500 with less downtime for maintenance and repair.

Edge Cleaning Apparatus

To assure that the lamination process (step 134) forms a desirable bond between the bonding material (e.g., Polyvinyl Butyral (PVB)) and the substrate surface 302A (FIG. 11B) during the substrate surface and edge deletion step 126, it has been found that the cleanliness of the surface 302A in the formed edge region 1002 is important. As noted above, a strong bond prevents or inhibits the encroachment of environmental contaminants that can attack the active regions of the solar cell device, such as the solar cell 300. Material removal from the edge of the device substrate 303 may also be useful to isolate and prevent electrical shorts in the final formed solar cell device.

FIG. 11B is a simplified schematic diagram that illustrates a cross-sectional view of an edge region 1002 formed on a device substrate 303 during step 126. The edge regions 1002 are formed by removing portions of the device substrate 303, which may comprise a plurality of material layers 1004 (e.g., reference numerals 310-350 of FIG. 3D) that were deposited on the surface 302B of the substrate 302.

Figure 10:
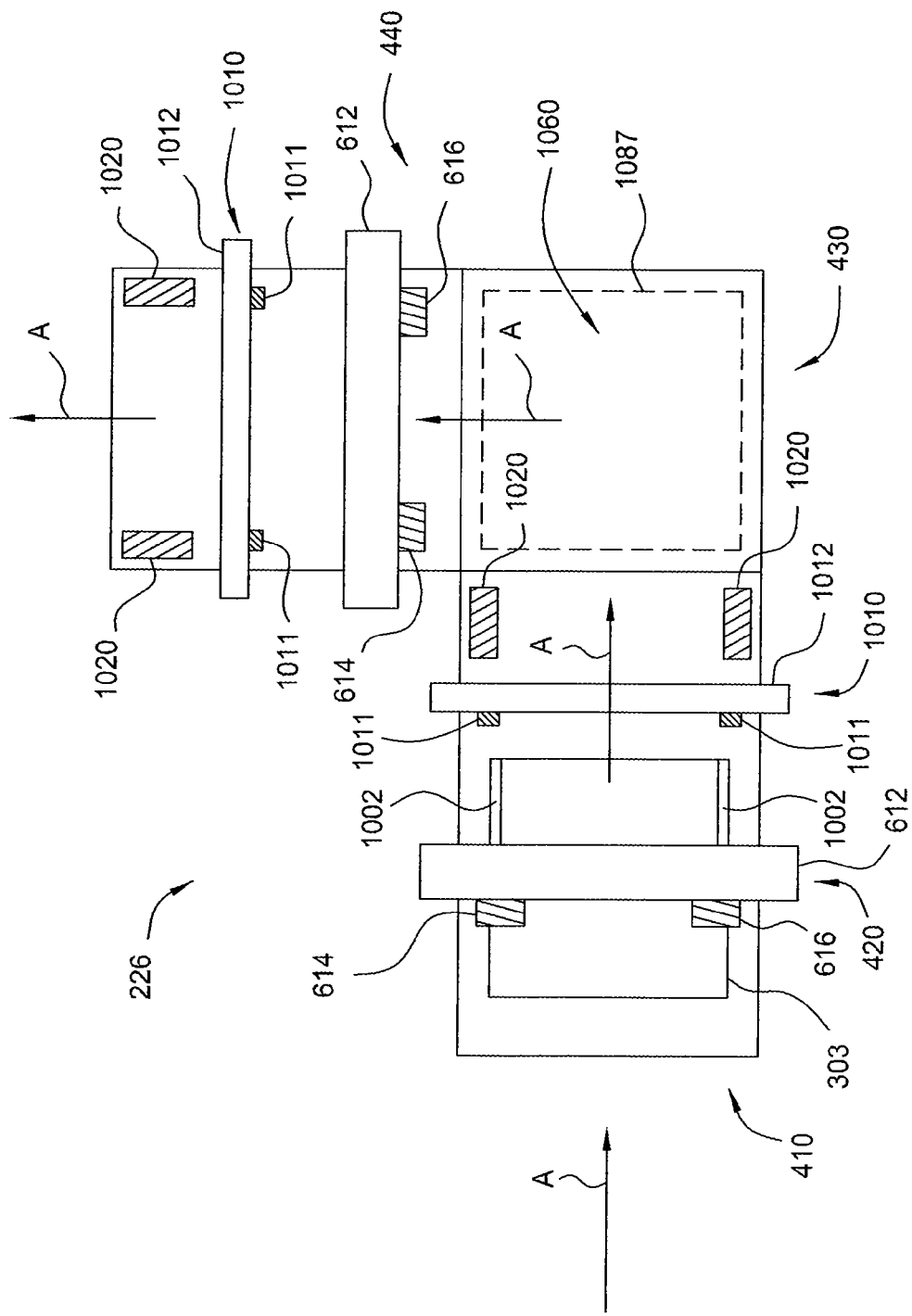
FIG. 10 illustrates a schematic plan view of one embodiment of the edge deletion module according to the present invention.

FIG. 10 is a schematic plan view of one embodiment of the seamer/edge deletion module 226 having a plurality of cleaning modules 1010 that are positioned to clean the edge region 1002 of the device substrate 303 after performing step 126. During processing, an inlet conveyor 410, such as the automation device 281, transports the device substrate 303 into a first edge deletion station 420 following path "A". In the first edge deletion station 420, two opposing side edges (e.g., edge regions 1002) of the device substrate 303 are processed using the stationary grinding wheel device 614 and the movable grinding wheel device 616, as discussed above. In one embodiment, after the edge regions 1002 have been formed by the first edge deletion station 420, they are each cleaned using an adjacently positioned cleaning module 1010. Next, the device substrate 303 enters a cross transfer station 430. At this point, the device substrate 303 is fed into a second edge deletion station 440. In the second edge deletion station 440, the remaining two opposing side edges of the device substrate 303 are processed, and material is removed therefrom. In one embodiment, after the edge regions 1002 have been formed by the second edge deletion station 440, they are each cleaned using an adjacently positioned cleaning module 1010. At this point, the substrate surface and edge deletion process, or step 126, is complete, and the device substrate 303 exits the seamer/edge deletion module 226 following path "A" for further processing as previously described.

Figure 11A:
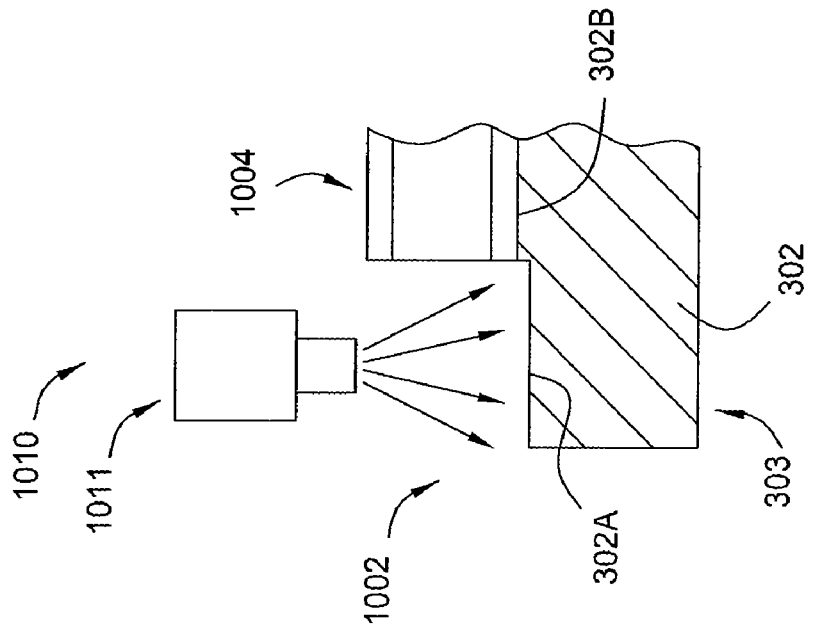
FIG. 11A is a side view of an edge deletion grinding wheel device during processing according to one embodiment of the present invention.
Figure 11A:
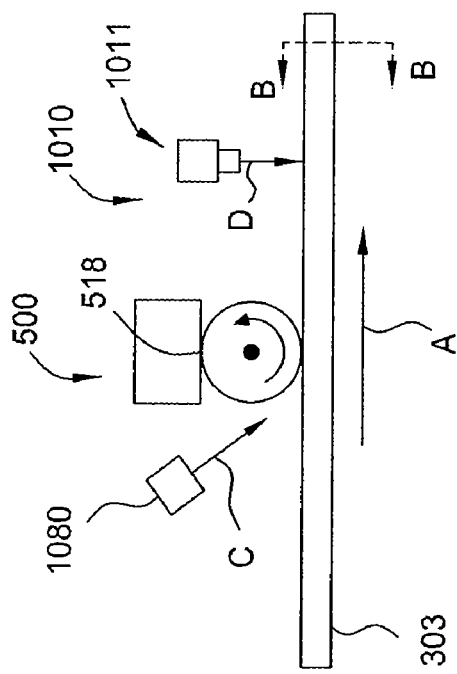

FIG. 11A is a side view of a device substrate 303 during a portion of the edge deletion process (step 126) in which a grinding wheel 518 in the device 500 is used to form the edge regions 1002. As shown, the device substrate 303 is fed in a direction "A" so that the grinding wheel 518 can remove one or more of the material layers 1004 from the surface of the substrate 302. The device 500 may also include a lubricating source 1080 that is positioned to provide a lubricating fluid "C" to the grinding wheel 518 and the surface of the device substrate 303 to enhance the edge deletion process results. In one example, the lubricating fluid "C" comprises deionized (DI) water. It has been found that by controlling the substrate feed rate, providing a lubricating fluid "C", and controlling the grit size in the grinding wheel 518, a smoother surface can be obtained, which tends to improve the bond created between the bonding material (e.g., PVB) and the edge regions 1002 during the laminating process step (step 134). In one example, the substrate feed rate across the device 500 may be about 10 m/min and the grit size in the grinding wheel 518 is greater than about 440 grit. In one example, the grit size in the grinding wheel 518 is between about 440 grit and about 700 grit.

In one embodiment, as shown in FIGS. 11A-11B, a cleaning module 1010 is positioned to clean a portion of the formed edge regions 1002 using a spray source 1011. In this configuration, a fluid spray "D" is directed towards at least a portion of the edge regions 1002 to lift off and remove any residual material remaining on the surface 302A of the formed edge regions 1002. In one embodiment, the fluid spray "D" is a high pressure fluid spray that is directed substantially across the entire edge region 1002. In one example, the cleaning process includes directing a fluid spray "D" comprising a fluid, such as DI water at a supply pressure greater than about 50 bar at the edge region 1002. In another example, the cleaning process comprises directing a fluid, such as DI water at a supply pressure between about 50 bar and about 150 bar at the edge region 1002. DI water may be supplied at a resistivity between about 8 Mega Ohms-cm and about 18 Mega Ohm-cm. In general, the fluid contained in the fluid spray could contain DI water, one or more surfactants (e.g., non-ionic surfactants), isopropyl alcohol, or other suitable materials, and combinations thereof, that are able to remove particles (e.g., glass particles, removed material layer 1004 debris, oils) from the edge regions 1002. In one embodiment, it is desirable to provide a gas in the pressurized fluid contained in the pressurized fluid spray "D" to improve the cleaning efficiency. The provided gas may be clean dry air (CDA), nitrogen or other similar gas.

Figure 12:
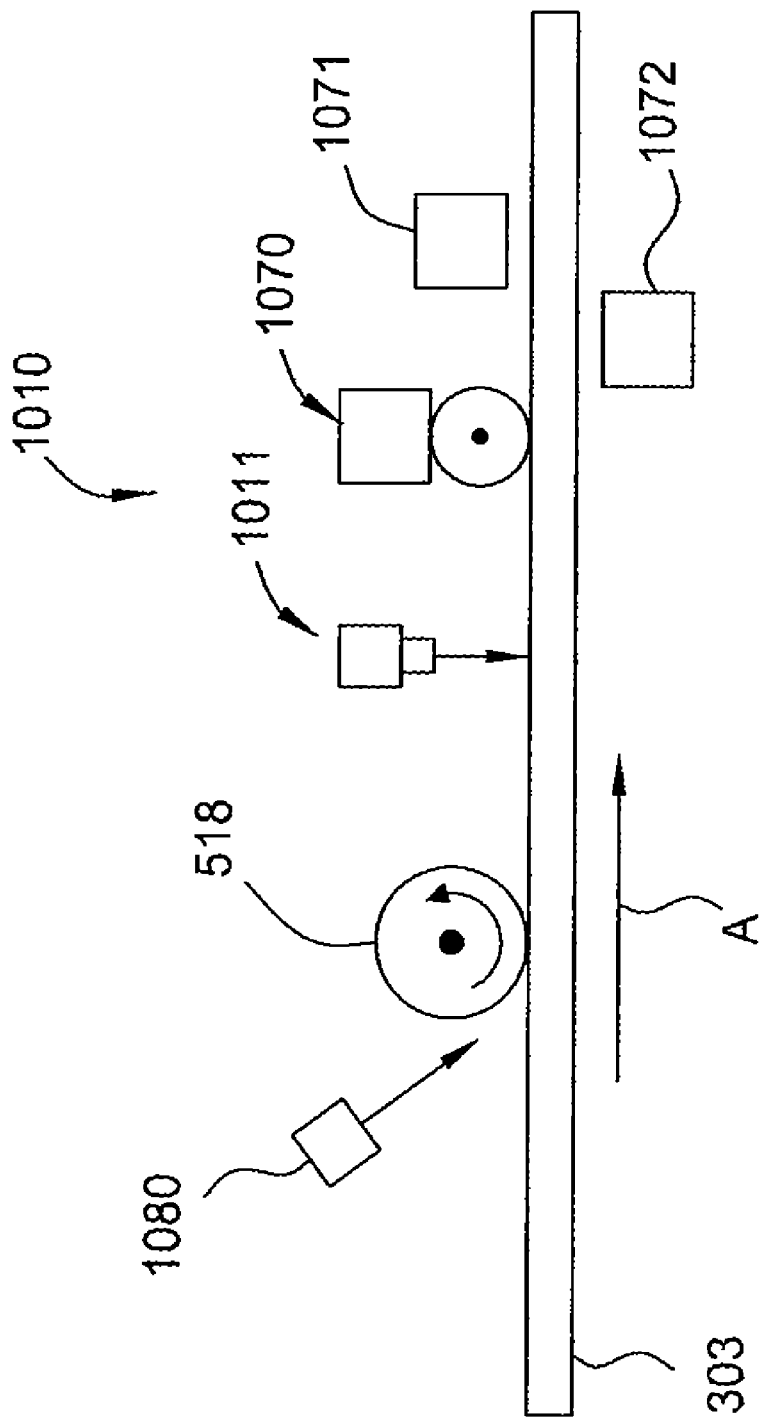
FIG. 12 is a side view of an edge deletion grinding wheel device according to one embodiment of the present invention.

Referring to FIGS. 10 and 12, the cleaning module 1010 contained in the seamer/edge deletion module 226 may contain one or more cleaning elements that are used to clean the edge regions 1002 of the substrate 303. In one embodiment, the one or more cleaning elements include two or more spray sources 1011 that are positioned on a support structure 1012 within the first edge deletion station 420 so that they can deliver the fluid spray "D" to the formed edge regions 1002, and two or more spray source 1011 are positioned on a support structure 1012 within the second edge deletion station 440 so that they can deliver the fluid spray "D" to the subsequently formed edge regions 1002.

In another embodiment, the one or more cleaning elements include an abrasive polishing wheel 1070 that is used to remove particles from the edge region 1002 by use of mechanical friction and by further polishing of the surface 302A. In one embodiment, the abrasive polishing wheel 1070 includes a separate rotating wheel that has a fine diamond or silica based powder or paste disposed on its surface to further abrade the surface of the device substrate 303 as it is passed under the abrasive polishing wheel 1070.

In another embodiment, the one or more cleaning elements include a material removal wheel 1071 that is used to remove particles from the edge region 1002 by use of mechanical friction. In one embodiment, the material removal wheel 1071 includes a separate rotating wheel that has a plurality of bristles (e.g., >0.15 µm nylon bristles) that are moved relative to the edge region 1002 to remove any attached particles. In another embodiment, the material removal wheel 1071 includes a tape dispensing assembly that dispenses and removes a length of adhesive-containing material to pick-up and remove any particles that the adhesive-containing material contacts in the edge region 1002. The adhesive containing material is thus generally used to bond and retain the particles that it contacts as it is dispensed "on" and removed "from" the edge region 1002. In one embodiment, the tape dispensing assembly is used to test the cleanliness of the edge region 1002 by use of microscope inspection of regions of the adhesive material that were placed in contact with the edge region 1002.

Figure 13:
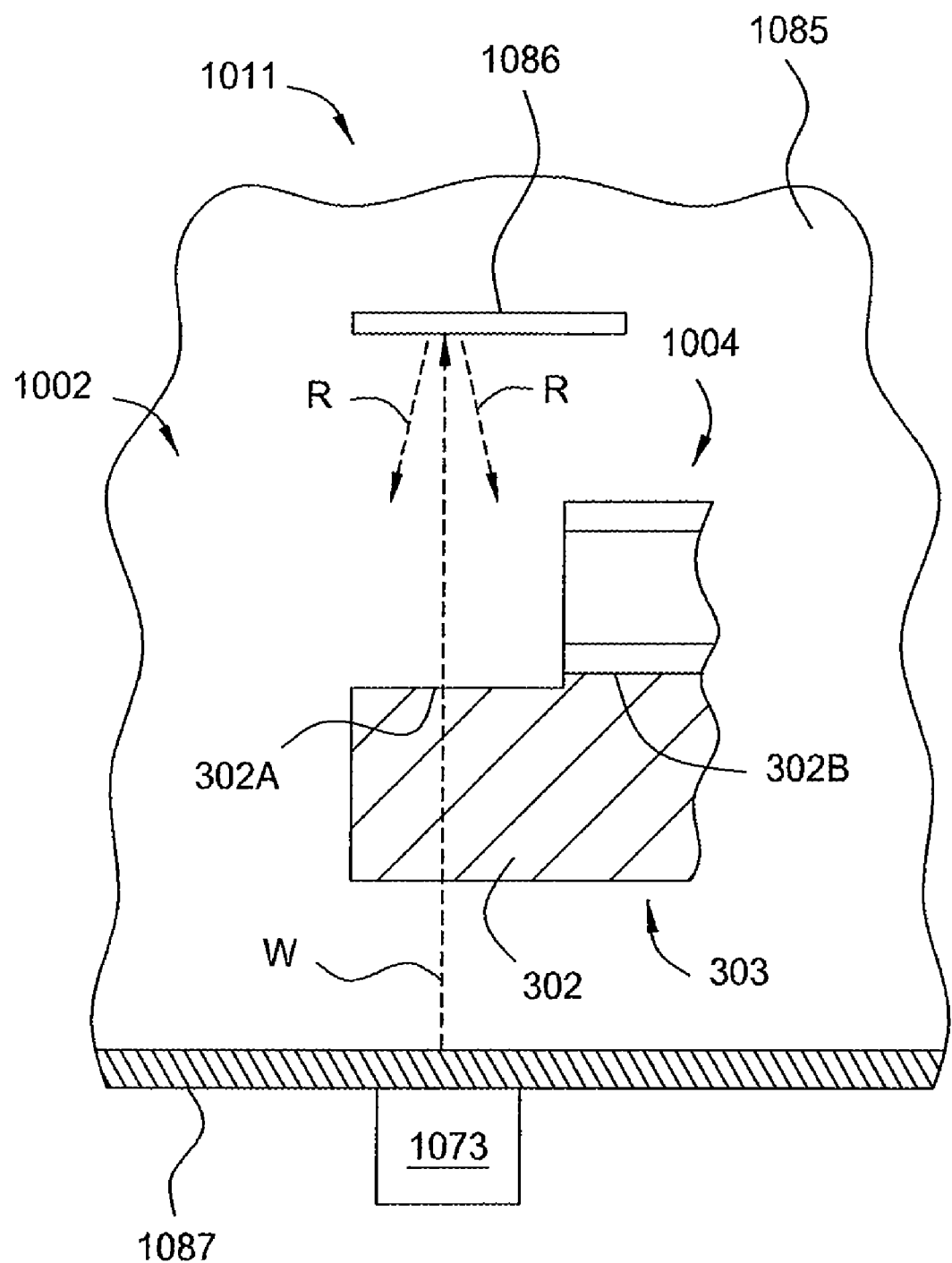
FIG. 13 is a side view of a substrate having an edge region prepared according to one embodiment of the present invention.
Figure 14:
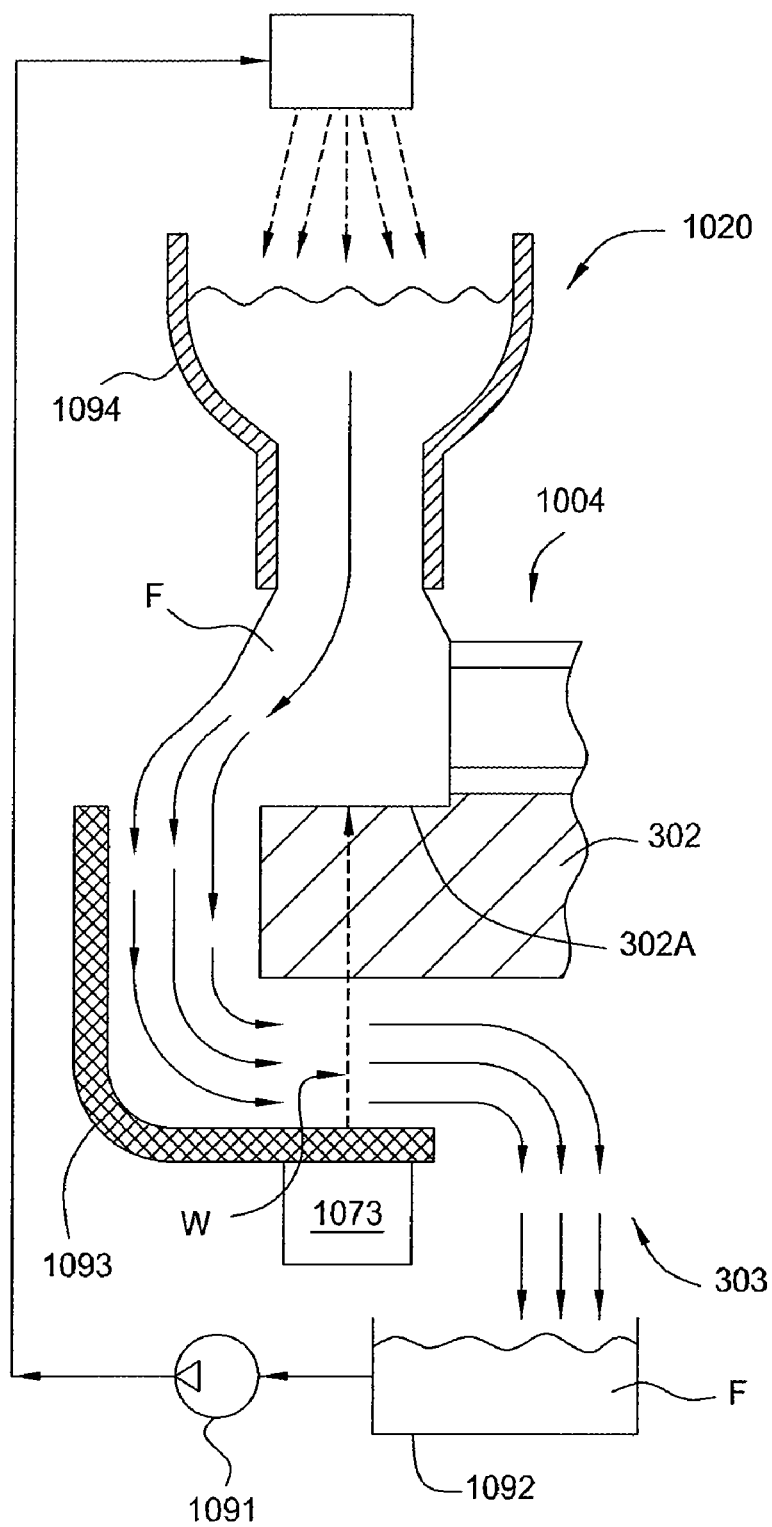
FIG. 14 is a side view of a substrate having an edge region prepared according to one embodiment of the present invention.

In another embodiment, the one or more cleaning elements include an ultrasonic transducer assembly 1072 that is used to remove particles from the edge region 1002 by use of energy delivered from a ultrasonic transducer 1073 (FIGS. 13 and 14). In one embodiment, the ultrasonic transducer assembly 1072 includes positioning the ultrasonic transducer 1073 underneath the substrate 302 so that ultrasonic energy can be delivered through the substrate 302 to lift-off the particles residing on the surface 302A of the edge region 1002.

In one embodiment, as illustrated in FIG. 13, the device substrate 303 is immersed in a fluid bath 1085 so that ultrasonic energy can be delivered from the ultrasonic transducer 1073 to the substrate 302. In one embodiment, the cross transfer station 430 contains a tank 1060 (FIG. 10) in which ultrasonic energy is delivered to the device substrate 303. In this configuration, the device substrate 303 is immersed into and removed from the tank 1060 as it passes through the seamer/edge deletion module 226. In one example, the tank 1060 has one or more walls 1087 that are adapted to retain a fluid, such as DI water. In one embodiment, a reflector 1086 is positioned so that the ultrasonic waves delivered from the ultrasonic transducer 1073 are reflected back towards the surface 302A of the device substrate 303. The reflector 1086 is generally a solid material, such as plastic, metal or ceramic material that is disposed in the fluid bath 1085.

In another embodiment, as illustrated in FIG. 14, the edge region 1002 is principally exposed to a fluid "F", which is provided by an edge dispense assembly 1020 (FIGS. 10), so that ultrasonic energy can be delivered from an ultrasonic transducer 1073 to the edge region 1002. In one embodiment, the edge dispense assembly 1020 contains a fluid tank 1092, pump 1091, flow diverter 1094, flow collection element 1093 and ultrasonic transducer 1073. When in use the pump 1091 is adapted to deliver the fluid "F" to the flow diverter 1094 that directs the fluid to the edge region 1002 and flow collection element 1093 so that the fluid "F" contacts the edge region 1002 and back surface of the substrate 302 before it is returned to the fluid tank 1092. In this configuration, the ultrasonic transducer 1073 is positioned to deliver ultrasonic energy to the back of the substrate 302 and edge region 1002 through the flowing fluid "F". In one embodiment, the ultrasonic treatment is applied to the edges of the device substrate 303 as it passes through the seamer/edge deletion module 226. The fluid "F" may comprise a fluid, such as DI water.

While the foregoing is directed to embodiments of the present invention, other and further embodiments of the invention may be devised without departing from the basic scope thereof, and the scope thereof is determined by the claims that follow.

The invention claimed is:

1. A module for performing an edge deletion process on a solar cell device, comprising:
   an inlet conveyor configured to transport the solar cell device into the module;
   an edge deletion station configured to remove material from a top surface of the solar cell device at opposing edge regions of the solar cell device, wherein the edge deletion station comprises:
      a station support structure;
      a stationary grinding wheel device attached to the station support structure, wherein the stationary grinding wheel device comprises a stationary grinding wheel;
      a movable grinding wheel device disposed on the station support structure, wherein the movable grinding wheel device comprises a movable grinding wheel;
      a first automatic dressing device attached to the stationary grinding wheel device; and
      a second automatic dressing device attached to the movable grinding wheel device, wherein the first automatic dressing device and the second automatic dressing device each comprises:
         a lateral advancing device to advance an abrasive element toward the grinding wheel;
         a sensing mechanism configured to determine when the abrasive element is in a fully extended position; and
         a sensing mechanism configured to determine when the abrasive element is in a fully retracted position; and
   a cleaning assembly.

2. The module of claim 1, wherein the stationary grinding wheel device further comprises:
   a stationary grinding wheel device support structure having a vertical adjustment member, a horizontal adjustment member, and an angular adjustment member; and
   a stationary grinding wheel motor.

3. The module of claim 2, wherein the movable grinding wheel device comprises:
   a movable grinding wheel device support having a vertical adjustment member, a horizontal adjustment member, and an angular adjustment member;
   a movable grinding wheel motor; and
   a solar cell device edge position sensor.

4. The module of claim 3, further comprising an actuator configured to laterally position the movable grinding wheel device based on information provided by the solar cell device edge position sensor.

5. The module of claim 3, wherein the stationary grinding wheel and the movable grinding wheel each comprise:
   channels configured to direct fluid from an inner circumference of the grinding wheel to a grinding surface of the grinding wheel; and
   an open slot on the grinding surface of the grinding wheel in fluid communication with the channels.

6. The module of claim 3, wherein the stationary grinding wheel device and the movable grinding wheel device each further comprise a constant pressure device configured to provide a constant pressure from the grinding wheel to the surface of the solar cell device regardless of the thickness of the solar cell device.

7. The module of claim 3, wherein the first and second automatic dressing devices each further comprises a longitudinal advancing device.

8. The module of claim 3, wherein the stationary grinding wheel device and the movable grinding wheel device each further comprises:
   a compensation device configured to determine losses in the radius of the grinding wheel and send a signal to a controller, wherein the lateral advancing device is configured to receive commands from the controller and laterally advance the abrasive element toward the grinding wheel a specified distance, wherein the specified distance accounts for the losses in the radius of the grinding wheel.

9. The module of claim 3, wherein the cleaning assembly comprises a fluid spray nozzle directed at the edge regions of the solar cell device downstream from the stationary grinding wheel device and the movable grinding wheel device.

10. The module of claim 9, wherein the cleaning assembly further comprises a material removal wheel configured to contact the edge regions of the solar cell device downstream from the fluid spray nozzle.

11. The module of claim 3, wherein the cleaning assembly comprises:
    a fluid tank;
    a fluid pump in fluid communication with the fluid tank;
    a flow diverter configured to divert flow from the fluid pump onto the edge regions of the solar cell device;
    a flow collection element disposed to collect fluid from the edge regions of the solar cell device; and
    an ultrasonic transducer disposed below the solar cell device and configured to transmit ultrasonic energy to the solar cell device.

12. A module for performing an edge deletion process on a solar cell device, comprising:
    an inlet conveyor configured to transport the solar cell device into the module;
    a first edge deletion station configured to remove material from the top surface of the solar cell device at opposing edge regions of the solar cell device, wherein the first edge deletion station comprises a station support structure, a stationary grinding wheel device attached to the station support structure, a first automatic dressing device attached to the stationary grinding wheel device, a movable grinding wheel device disposed on the station support structure, and a second automatic dressing device attached to the movable grinding wheel device, wherein the stationary grinding wheel device comprises a stationary grinding wheel and the movable grinding wheel device comprises a movable grinding wheel, and wherein the first automatic dressing device and the second automatic dressing device each further comprises:
       a lateral advancing device to advance an abrasive element toward the grinding wheel;
       a sensing mechanism configured to determine when the abrasive element is in a fully extended position; and
       a sensing mechanism configured to determine when the abrasive element is in a fully retracted position;
    a second edge deletion station configured to remove material from the top surface of the solar cell device at the remaining opposing edge regions of the solar cell device, wherein the second edge deletion station comprises a station support structure, a stationary grinding wheel device, and a movable grinding wheel device;
a cleaning assembly;
a cross transfer station configured to transport the solar cell device from the first edge deletion station to the second edge deletion station; and
an outlet conveyor configured to transport the solar cell device out of the module.

13. The module of claim 12, wherein the cleaning assembly comprises:
a fluid spray nozzle directed at the edge regions of the solar cell device downstream from the stationary grinding wheel device and the movable grinding wheel device; and
a material removal wheel configured to contact the edge regions of the solar cell device downstream from the fluid spray nozzle.

14. The module of claim 12, wherein each movable grinding wheel device comprises:
a sensor configured to sense the position of an edge of the solar cell device and send information to a controller; and
an actuator configured to receive signals from the controller and laterally position the movable grinding wheel device based on information provided by the sensor.

15. The module of claim 14, wherein each stationary grinding wheel device further comprises:
a grinding wheel device support structure having a vertical adjusting member, a horizontal adjusting member, and an angle adjusting member, wherein the grinding wheel has coolant channels located therein, wherein the coolant channels fluidly connect an inner surface of the grinding wheel to a grinding surface of the grinding wheel.

16. The module of claim 15, wherein each stationary grinding wheel device further comprises a compensation device configured to determine losses in the radius of the grinding wheel and send a signal to the controller.

17. The module of claim 16, wherein each stationary grinding wheel device further comprises a constant pressure device configured such that a constant pressure is exerted by the grinding wheel onto the top surface of the solar cell device regardless of the thickness of the solar cell device.

18. The module of claim 16, wherein the lateral advancing device is configured to receive commands from the controller and laterally advance the abrasive element toward the grinding wheel a specified distance, wherein the specified distance accounts for the losses in the radius of the grinding wheel.

19. The module of claim 16, wherein each automatic dressing device further comprises a longitudinal advancing device.

* * * * *